United States Patent
Yoshida et al.

(10) Patent No.: US 9,053,931 B2
(45) Date of Patent: Jun. 9, 2015

(54) NITRIDE SEMICONDUCTOR WAFER, NITRIDE SEMICONDUCTOR DEVICE, AND METHOD FOR MANUFACTURING NITRIDE SEMICONDUCTOR WAFER

(71) Applicants: Hisashi Yoshida, Kanagawa-ken (JP); Toshiki Hikosaka, Kanagawa-ken (JP); Yoshiyuki Harada, Tokyo (JP); Naoharu Sugiyama, Kanagawa-ken (JP); Shinya Nunoue, Chiba-ken (JP)

(72) Inventors: Hisashi Yoshida, Kanagawa-ken (JP); Toshiki Hikosaka, Kanagawa-ken (JP); Yoshiyuki Harada, Tokyo (JP); Naoharu Sugiyama, Kanagawa-ken (JP); Shinya Nunoue, Chiba-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/626,265

(22) Filed: Sep. 25, 2012

(65) Prior Publication Data
US 2014/0061693 A1    Mar. 6, 2014

(30) Foreign Application Priority Data
Sep. 5, 2012 (JP) ................ 2012-195586

(51) Int. Cl.
| | |
|---|---|
| H01L 21/02 | (2006.01) |
| H01L 29/10 | (2006.01) |
| H01L 29/205 | (2006.01) |
| H01L 33/32 | (2010.01) |
| H01L 33/06 | (2010.01) |

(52) U.S. Cl.
CPC .... *H01L 21/02381* (2013.01); *H01L 21/02458* (2013.01); *H01L 21/02505* (2013.01); *H01L 21/0254* (2013.01); *H01L 21/0262* (2013.01)

(58) Field of Classification Search
USPC ................. 257/13, 22, 76, 194, 615; 438/37
See application file for complete search history.

(56) References Cited

U.S. PATENT DOCUMENTS

| | | | | |
|---|---|---|---|---|
| 7,745,850 B2 * | 6/2010 | Otsuka et al. | ................. | 257/194 |
| 2002/0038892 A1 * | 4/2002 | Otani et al. | ................... | 257/352 |
| 2002/0074552 A1 | 6/2002 | Weeks, Jr. et al. | | |

(Continued)

FOREIGN PATENT DOCUMENTS

| | | |
|---|---|---|
| JP | 2001-230447 A | 8/2001 |
| JP | 2004-524250 | 8/2004 |

(Continued)

OTHER PUBLICATIONS

Celebrating the 100th anniversary of the Stoney equation for film stress: Developments from polycrystalline steel strips to single crystal silicon wafers by Janssen et al.*

(Continued)

*Primary Examiner* — Shaun Campbell
*Assistant Examiner* — Thai T Vuong
(74) *Attorney, Agent, or Firm* — Oblon, McClelland, Maier & Neustadt, L.L.P.

(57) ABSTRACT

According to one embodiment, a nitride semiconductor wafer includes: a silicon substrate; a buffer section provided on the silicon substrate; and a functional layer provided on the buffer section and contains nitride semiconductor. The buffer section includes first to n-th buffer layers (n being an integer of 4 or more) containing nitride semiconductor. An i-th buffer layer (i being an integer of 1 or more and less than n) of the first to n-th buffer layers has a lattice length Wi in a first direction parallel to a major surface of the first buffer layer. An (i+1)-th buffer layer provided on the i-th buffer layer has a lattice length W(i+1) in the first direction. In the first to n-th buffer layers the i-th buffer layer and the (i+1)-th buffer layer satisfy relation of $(W(i+1)-Wi)/Wi \leq 0.008$.

37 Claims, 12 Drawing Sheets

(56) References Cited

U.S. PATENT DOCUMENTS

| | | |
|---|---|---|
| 2002/0187356 A1 | 12/2002 | Weeks, Jr. et al. |
| 2003/0232457 A1* | 12/2003 | Kawaguchi et al. ............ 438/46 |
| 2004/0119067 A1 | 6/2004 | Weeks, Jr. et al. |
| 2008/0029756 A1* | 2/2008 | Hudait et al. ................... 257/14 |
| 2009/0008647 A1* | 1/2009 | Li et al. ........................... 257/76 |
| 2009/0072262 A1* | 3/2009 | Iza et al. ......................... 257/98 |
| 2009/0104758 A1 | 4/2009 | Weeks, Jr. et al. |
| 2009/0200645 A1* | 8/2009 | Kokawa et al. ............... 257/615 |
| 2009/0283795 A1* | 11/2009 | Miki et al. .................... 257/103 |
| 2010/0123169 A1* | 5/2010 | Sato .............................. 257/183 |
| 2010/0213577 A1* | 8/2010 | Kato et al. .................... 257/615 |
| 2010/0301379 A1* | 12/2010 | Yokoyama et al. ........... 257/103 |
| 2011/0001127 A1* | 1/2011 | Sakamoto et al. .............. 257/22 |
| 2011/0024796 A1* | 2/2011 | Miyoshi et al. ............... 257/194 |
| 2011/0084307 A1* | 4/2011 | Miki et al. .................... 257/103 |
| 2011/0101391 A1* | 5/2011 | Miki et al. ...................... 257/94 |
| 2012/0119223 A1 | 5/2012 | Weeks, Jr. et al. |
| 2013/0026486 A1* | 1/2013 | Miyoshi et al. ................. 257/76 |
| 2013/0112990 A1 | 5/2013 | Weeks, Jr. et al. |

FOREIGN PATENT DOCUMENTS

| | | |
|---|---|---|
| JP | 2004-289005 A | 10/2004 |
| JP | 2009-158804 A | 7/2009 |
| JP | 2012-243871 A | 12/2012 |
| JP | 2013-4681 A | 1/2013 |
| WO | WO 02/48434 A2 | 6/2002 |
| WO | WO 2011/135963 A1 | 11/2011 |

OTHER PUBLICATIONS

Office Action issued May 10, 2013, in Japanese Patent Application No. 2012-195586 with English translation.
Extended European Search Report issued Dec. 5, 2013, in Patent Application No. 13175320.4.
Office Action issued on Sep. 1, 2014 in the corresponding Korean patent Application No. 10-2013-91854 (with English Translation).
Office Action dated Jan. 12, 2015 issued in corresponding Korean Patent Application No. 10-2014-150124 with English translation.

* cited by examiner

FIG. 4

|  | SP01 | SP02 | SP03 |
|---|---|---|---|
| t0 (μm) | 525 | 525 | 950 |
| t1 (nm) | 120 | 120 | 120 |
| GT1 (°C) | 1170 | 1170 | 1170 |
| TMA1 (ccm) | 25 | 25 | 25 |
| N1 (lm) | 0.8 | 0.8 | 0.8 |
| GR1 (nm/min) | 6.1 | 6.1 | 6.1 |
| t2 (nm) | 100 | 100 | 100 |
| x2 | 0.517 | 0.713 | 0.557 |
| GT2 (°C) | 1140 | 1140 | 1140 |
| TMA2 (ccm) | 50 | 50 | 50 |
| TMG2 (ccm) | 11.0 | 5.1 | 9.8 |
| N2 (lm) | 2.5 | 2.5 | 2.5 |
| GR2 (nm/min) | 12.2 | 12.2 | 12.2 |
| t3 (nm) | 200 | 200 | 215 |
| x3 | 0.292 | 0.458 | 0.309 |
| GT3 (°C) | 1140 | 1140 | 1140 |
| TMA3 (ccm) | 30 | 50 | 30 |
| TMG3 (ccm) | 16.8 | 12 | 16.8 |
| N3 (lm) | 2.5 | 2.5 | 2.5 |
| GR3 (nm/min) | 20.8 | 20.8 | 20.8 |
| t4 (nm) | 250 | 250 | 250 |
| x4 | 0.158 | 0.252 | 0.162 |
| GT4 (°C) | 1140 | 1140 | 1140 |
| TMA4 (ccm) | 15.1 | 25 | 15.1 |
| TMG4 (ccm) | 20.4 | 18 | 20.4 |
| N4 (lm) | 2.5 | 2.5 | 2.5 |
| GR4 (nm/min) | 22.7 | 22.7 | 22.7 |
| t5 (nm) | 365 | 400 | 400 |
| GT5 (°C) | 1230 | 1230 | 1230 |
| TMG5 (ccm) | 47 | 47 | 47 |
| N5 (lm) | 20 | 20 | 20 |
| GR5 (nm/min) | 36.3 | 36.3 | 36.3 |

FIG. 6

|  | SP01 | SP02 | SP03 |
|---|---|---|---|
| CF1 ($km^{-1}$) | 18.3 | 16.4 | 4.4 (14.4) |
| LM2 (%) | 0.46 | 0.12 | 0.30 |
| SR2 | 0.39 | 0.18 | 0.28 |
| CF2a ($km^{-1}$) | −20.7 | −9.9 | −5.5 (−18.1) |
| CF2 ($km^{-1}$) | −20.7 | −9.9 | −5.5 (−18.1) |
| LM3 (%) | 0.66 | 0.55 | 0.80 |
| SR3 | 0.52 | 0.46 | 0.58 |
| CF3a ($km^{-1}$) | −26.9 | −22.6 | −7.9 (−25.8) |
| CF3 ($km^{-1}$) | −41.1 | −33.4 | −11.8 (−38.5) |
| LM4 (%) | 0.34 | 0.47 | 0.38 |
| SR4 | 0.37 | 0.41 | 0.41 |
| CF4a ($km^{-1}$) | −13.9 | −17.9 | −4.1 (−13.3) |
| CF4 ($km^{-1}$) | −33.1 | −35.9 | −9.1 (−29.8) |
| LM5 (%) | 0.63 | 0.96 | 0.57 |
| SR5 | 0.65 | 0.74 | 0.60 |
| CF5a ($km^{-1}$) |  | −9.4 | −6.9 (−22.6) |
| CF5 ($km^{-1}$) |  | −18.0 | −13.4 (−44.0) |
| LMt (%) | 2.10 | 2.12 | 2.07 |
| CFa ($km^{-1}$) |  | −59.7 | −24.4 (−79.8) |
| CFt ($km^{-1}$) |  | −97.2 | −39.8 (−130.4) |

US 9,053,931 B2

NITRIDE SEMICONDUCTOR WAFER, NITRIDE SEMICONDUCTOR DEVICE, AND METHOD FOR MANUFACTURING NITRIDE SEMICONDUCTOR WAFER

CROSS-REFERENCE TO RELATED APPLICATIONS

This application is based upon and claims the benefit of priority from the prior Japanese Patent Application No. 2012-195586, filed on Sep. 5, 2012; the entire contents of which are incorporated herein by reference.

FIELD

Embodiments described herein relate generally to a nitride semiconductor wafer, a nitride semiconductor device, and a method for manufacturing nitride semiconductor wafer.

BACKGROUND

There are nitride semiconductor wafers in which a semiconductor layer containing nitride semiconductor is formed on a silicon substrate. Nitride semiconductor wafers are used in manufacturing e.g. light emitting diodes (LED), high speed electronic devices, or power devices. Nitride semiconductor wafers have the problem of being prone to cracks occurring in the semiconductor layer during manufacturing due to difference between the thermal expansion coefficient of the silicon substrate and the thermal expansion coefficient of the semiconductor layer.

BRIEF DESCRIPTION OF THE DRAWINGS

FIG. 4 is a table illustrating characteristics of the nitride semiconductor wafer;

FIG. 6 is a table illustrating characteristics of the nitride semiconductor wafer;

DETAILED DESCRIPTION

Figure 1:
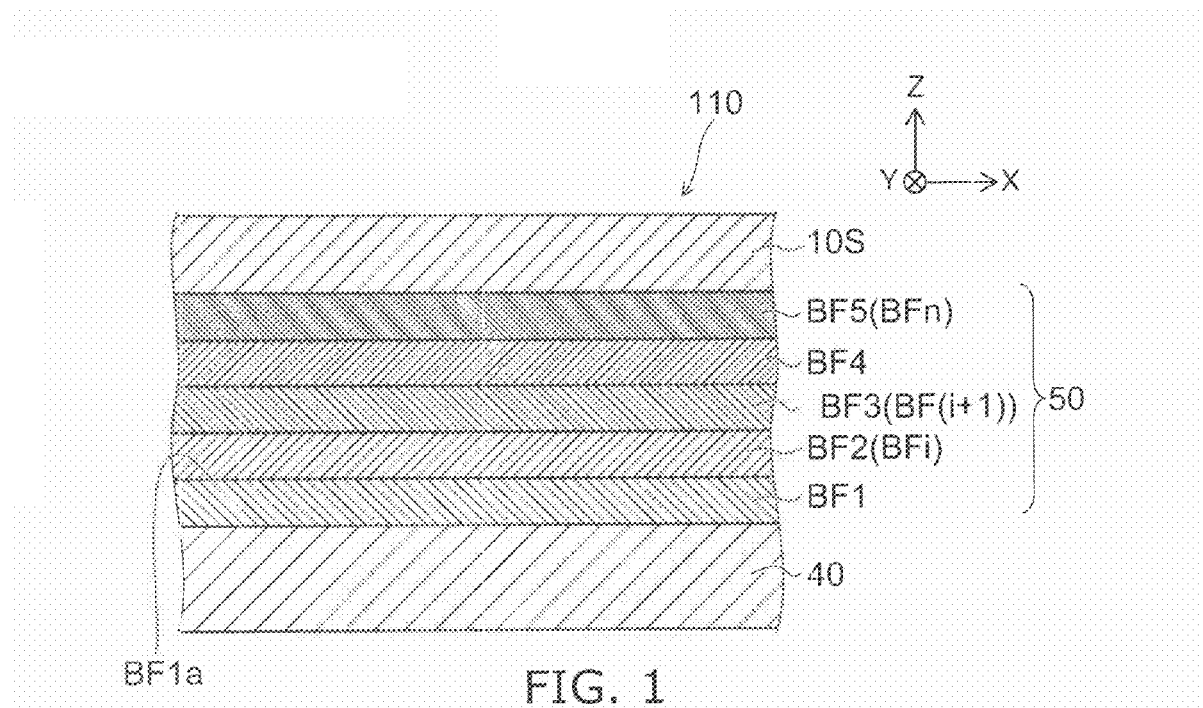
FIG. 1 is a schematic sectional view illustrating a configuration of a nitride semiconductor wafer according to a first embodiment.

According to one embodiment, a nitride semiconductor wafer includes: a silicon substrate; a buffer section provided on the silicon substrate; and a functional layer provided on the buffer section and contains nitride semiconductor. The buffer section includes first to n-th buffer layers (n being an integer of 4 or more) containing nitride semiconductor. An i-th buffer layer (i being an integer of 1 or more and less than n) of the first to n-th buffer layers has a lattice length $W_i$ in a first direction parallel to a major surface of the first buffer layer. An (i+1)-th buffer layer provided on the i-th buffer layer has a lattice length $W(i+1)$ in the first direction. In the first to n-th buffer layers the i-th buffer layer and the (i+1)-th buffer layer satisfy relation of $(W(i+1)-W_i)/W_i \le 0.008$.

According to another embodiment, a nitride semiconductor device includes: a buffer section formed on a silicon substrate and including first to n-th buffer layers (n being an integer of 4 or more) containing nitride semiconductor, an i-th buffer layer (i being an integer of 1 or more and less than n) of the first to n-th buffer layers having a lattice length $W_i$ in a first direction parallel to a major surface of the first buffer layer, an (i+1)-th buffer layer provided on the i-th buffer layer having a lattice length $W(i+1)$ in the first direction, and in the first to n-th buffer layers the i-th buffer layer and the (i+1)-th buffer layer satisfying relation of $(W(i+1)-W_i)/W_i \le 0.008$; and a functional layer provided on the buffer section and containing nitride semiconductor.

According to another embodiment, a method for manufacturing a nitride semiconductor wafer includes: forming a buffer section on a silicon substrate, the buffer section including first to n-th buffer layers (n being an integer of 4 or more) containing nitride semiconductor, an i-th buffer layer (i being an integer of 1 or more and less than n) of the first to n-th buffer layers having a lattice length $W_i$ in a first direction parallel to a major surface of the first buffer layer, an (i+1)-th buffer layer provided on the i-th buffer layer having a lattice length $W(i+1)$ in the first direction, and in the first to n-th buffer layers the i-th buffer layer and the (i+1)-th buffer layer satisfying relation of $(W(i+1)-W_i)/W_i \le 0.008$; and forming a functional layer containing nitride semiconductor on the buffer section.

Embodiments will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

(First Embodiment)

The nitride semiconductor wafer 110 according to this embodiment is used in manufacturing nitride semiconductor devices such as semiconductor light emitting devices, semiconductor light receiving devices, or electronic devices. The semiconductor light emitting devices include e.g. light emitting diodes (LED) and laser diodes (LD). The semiconductor light receiving devices include e.g. photodiodes (PD). The electronic devices include e.g. high electron mobility transistors (HEMT), heterojunction bipolar transistors (HBT), field effect transistors (FET), and Schottky barrier diodes (SBD).

FIG. 1 is a schematic sectional view illustrating the configuration of a nitride semiconductor wafer according to the first embodiment.

As shown in FIG. 1, the nitride semiconductor wafer 110 according to this embodiment includes a silicon substrate 40, a buffer section 50, and a functional layer 10s.

The buffer section 50 is provided on the silicon substrate 40. The functional layer 10s is provided on the buffer section 50. The functional layer 10s contains nitride semiconductor.

Here, the stacking direction from the silicon substrate 40 toward the functional layer 10s is referred to as Z-axis direction. One direction perpendicular to the Z-axis direction is referred to as X-axis direction. The direction perpendicular to the Z-axis direction and the X-axis direction is referred to as Y-axis direction.

In this description, the term "stacked" includes not only the case of being stacked in contact with each other, but also the case of being stacked with another layer interposed in between. The term "provided on" includes not only the case of being provided in direct contact, but also the case of being provided with another layer interposed in between.

The buffer section 50 includes a plurality of buffer layers from a first buffer layer BF1 to an n-th buffer layer BFn, where n is an integer of 4 or more. The i-th buffer layer BFi of the first to n-th buffer layers BF1-BFn has a lattice length Wi in a first direction parallel to the major surface BF1a of the first buffer layer BF1, where i is an integer of 1 or more and less than n.

The (i+1)-th buffer layer BF(i+1) provided on the i-th buffer layer BFi has a lattice length W(i+1) in the first direction. In the first to n-th buffer layers BF1-BFn, adjacent buffer layers in the Z-axis direction (i.e. i-th buffer layer BFi and (i+1)-th buffer layer BF(i+1)) satisfy the relation of $(W(i+1)-Wi)/Wi \leq 0.008$. As described later, $(W(i+1)-Wi)/Wi$ is preferably 0.003 or more.

For instance, the (i+1)-th buffer layer BF(i+1) is in contact with the i-th buffer layer BFi. For instance, the (i+1)-th buffer layer BF(i+1) may include a region having high silicon concentration near the interface with the i-th buffer layer BFi.

For instance, in the case where the major surface BF1a of the first buffer layer BF1 is a c-plane, the first direction is e.g. the a-axis direction. For instance, the lattice length Wi is a lattice length in the a-axis direction in the i-th buffer layer BFi.

In the following, for simplicity of description, it is assumed that the first direction is the a-axis direction. However, in the embodiments, the first direction can be an arbitrary direction parallel to the major surface BF1a (X-Y plane). The following description is applicable to the case where the a-axis direction is an arbitrary direction parallel to the major surface BF1a (X-Y plane).

The first to n-th buffer layers BF1-BFn contain nitride semiconductor. The first buffer layer BF1 contains e.g. $Al_{x1}Ga_{1-x1}N$ ($0<x1 \leq 1$). The n-th buffer layer BFn contains e.g. $Al_{xn}Ga_{1-xn}N$ ($0 \leq xn<1$). The i-th buffer layer BFi between the first buffer layer BF1 and the n-th buffer layer BFn contains e.g. $Al_{xi}Ga_{1-xi}N$ ($0<xi<1$). The first buffer layer BF1 is e.g. an AlN layer. The n-th buffer layer BFn is e.g. a GaN layer. The i-th buffer layer BFi between the first buffer layer BF1 and the n-th buffer layer BFn is e.g. an AlGaN layer. In the following description, it is assumed that the first buffer layer BF1 is an AlN layer, and the n-th buffer layer BFn is a GaN layer.

The lattice mismatch LM in the first direction (e.g., a-axis direction) between the i-th buffer layer BFi and the (i+1)-th buffer layer BF(i+1) can be determined by equation (1).

$$LM=(W(i+1)-Wi)/Wi \times 100 (\%) \quad (1)$$

Hereinbelow, LMc denotes lattice mismatch in an a-axis direction between AlN layer and GaN layer obtained from physical properties, LMt denotes lattice mismatch in the a-axis direction between AlN layer and GaN layer obtained from experiments, and LMx denotes lattice mismatch in the a-axis direction, between the adjacent buffer layers in the first buffer layer BF1 through n-th buffer layer BFn.

For instance, for adjacent buffer layers in the first to n-th buffer layers BF1-BFn, the lattice mismatch LMx in the a-axis direction satisfies the relation of $0.3\% \leq LMx \leq 0.8\%$.

The lattice mismatch LMc in the a-axis direction obtained from physical properties between the AlN layer and the GaN layer is 2.5%. The lattice mismatch LMt in the a-axis direction between AlN layer and GaN layer obtained from experiments is e.g. 1.9% or more and 2.5% or less. That is, the lattice mismatch LMt in the first direction between the first buffer layer BF1 and the n-th buffer layer BFn is 1.9% or more and 2.5% or less.

It is assumed that in the first to n-th buffer layers BF1-BFn, the lattice mismatch LMx in the a-axis direction between the adjacent buffer layers is constant. Then, in the case where the lattice mismatch LMx is approximately 0.8%, because $0.8 \times 3=2.4$, the number of AlGaN layers provided between the first buffer layer BF1 of AlN layer and the n-th buffer layer BFn of GaN layer is 2.

Furthermore, in the first to n-th buffer layers BF1-BFn, in the case where the lattice mismatch LMx in the a-axis direction between the adjacent buffer layers is constant and approximately 0.3%, because $0.3 \times 8=2.4$, the number of AlGaN layers provided between the first buffer layer BF1 of AlN layer and the n-th buffer layer BFn of GaN layer is 7.

That is, the number of AlGaN layers provided is 2 or more and 7 or less. Hence, the number n of layers provided in the buffer section 50 (including the first buffer layer BF1 and the n-th buffer layer BFn) is 4 or more and 9 or less.

In the case of forming an AlN layer on the silicon substrate 40, the lattice in the a-axis direction of the AlN layer is expanded due to the lattice constant difference between AlN and silicon. In the case of forming a GaN layer on an AlGaN layer, the lattice in the a-axis direction of the GaN layer is compressed due to the lattice length difference between GaN and AlGaN. Thus, the lattice mismatch LMt in the a-axis direction between the AlN layer and the GaN layer tends to become smaller than 2.5%. An experiment was performed to fabricate a plurality of nitride semiconductor wafer samples and to measure the lattice mismatch LMt in the a-axis direction between the AlN layer and the GaN layer. According to this experiment, the average of the lattice mismatch LMt was approximately 2.1%. That is, the actual lattice mismatch LMt in the a-axis direction between the AlN layer and the GaN layer is e.g. 2.0% or more and 2.2% or less.

The lattice mismatch LMx in the a-axis direction between the adjacent buffer layers in the first to n-th buffer layers BF1-BFn is adjusted by changing the Al composition ratio. From the first buffer layer BF1 toward the n-th buffer layer BFn, the Al composition ratio is gradually decreased. That is, the Al composition ratio in the (i+1)-th buffer layer BF(i+1) is lower than the Al composition ratio in the i-th buffer layer BFi.

In the following description, it is assumed that the number n of layers provided in the buffer section 50 is 5.

That is, the buffer section 50 includes first to fifth buffer layers BF1-BF5. The first buffer layer BF1 is provided on the silicon substrate 40. The second buffer layer BF2 is provided on the first buffer layer BF1. The third buffer layer BF3 is provided on the second buffer layer BF2. The fourth buffer layer BF4 is provided on the third buffer layer BF3. The fifth buffer layer BF5 is provided on the fourth buffer layer BF4. In this example, the fifth buffer layer BF5 is the n-th buffer layer BFn.

The first buffer layer BF1 contains e.g. $Al_{x1}Ga_{1-x1}N$ ($0<x1\leq1$). The second buffer layer BF2 contains e.g. $Al_{x2}Ga_{1-x2}N$ ($0<x2<x1$). The third buffer layer BF3 contains e.g. $Al_{x3}Ga_{1-x3}N$ ($0<x3<x2$). The fourth buffer layer BF4 contains e.g. $Al_{x4}Ga_{1-x4}N$ ($0<x4<x3$). The fifth buffer layer BF5 contains e.g. $Al_{x5}Ga_{1-x5}N$ ($0\leq x5<x4$). The composition ratios x1-x5 are in the relation of x1>x2>x3>x4>x5. The nitride semiconductor wafer 110 is configured so that e.g. x1=1, x2=0.5, x3=0.3, x4=0.15, and x5=0.

For instance, the second buffer layer BF2 is in contact with the first buffer layer BF1. The third buffer layer BF3 is in contact with the second buffer layer BF2. The fourth buffer layer BF4 is in contact with the third buffer layer BF3. The fifth buffer layer BF5 is in contact with the fourth buffer layer BF4.

The first to fifth buffer layers BF1-BF5 have lattice lengths in the first direction (e.g., a-axis direction), respectively, i.e., first to fifth lattice lengths W1-W5, respectively.

The second buffer layer BF2 and the first buffer layer BF1 satisfy the relation of e.g. $0.003\leq(W2-W1)/W1\leq0.008$. The third buffer layer BF3 and the second buffer BF2 satisfy the relation of e.g. $0.003\leq(W3-W2)/W2\leq0.008$. The fourth buffer layer BF4 and the third buffer layer BF3 satisfy the relation of e.g. $0.003\leq(W4-W3)/W3\leq0.008$. The fifth buffer layer BF5 and the fourth buffer layer BF4 satisfy the relation of e.g. $0.003\leq(W5-W4)/W4\leq0.008$.

Figure 2:
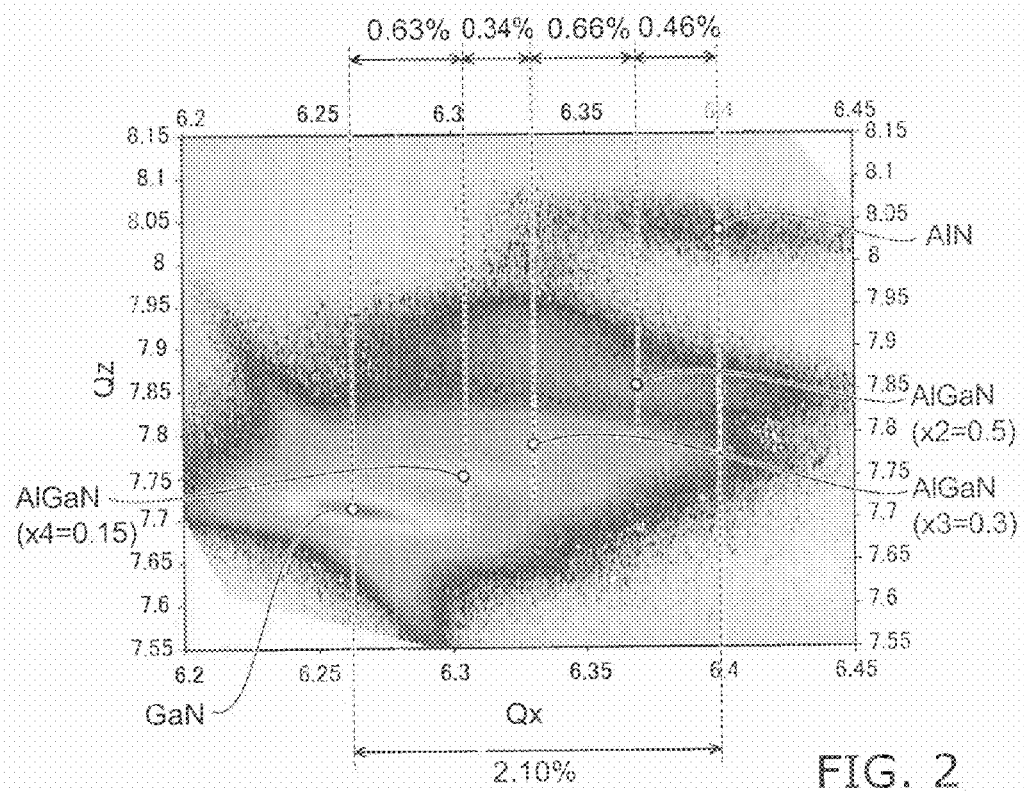
FIG. 2 is a reciprocal lattice space mapping illustrating a characteristics of the nitride semiconductor wafer according to the first embodiment.

FIG. 2 is a reciprocal lattice space mapping illustrating the characteristics of the nitride semiconductor wafer according to the first embodiment.

In FIG. 2, the horizontal axis represents the inverse Qx of the lattice constant in the $\langle 11\text{-}20\rangle$ direction. The vertical axis represents the inverse Qz of the lattice constant in the $\langle 0004\rangle$ direction.

FIG. 2 shows the result of measuring the reciprocal lattice space mapping of the nitride semiconductor wafer 110 (x1=1, x2=0.5, x3=0.3, x4=0.15, and x5=0).

As shown in FIG. 2, the lattice mismatches LMx in the a-axis direction of adjacent buffer layers in the Z-axis direction are 0.46%, 0.66%, 0.34%, and 0.63%. Thus, in the nitride semiconductor wafer 110, all of the lattice mismatches LMx in the a-axis direction of adjacent buffer layers in the Z-axis direction satisfy the relation of 0.3%≤LMx≤0.8%.

Thus, in the nitride semiconductor wafer 110 according to this embodiment, for instance, the lattice mismatch LMt between the AlN layer and the GaN layer is divided by a plurality of AlGaN layers so that all of the lattice mismatches LMx in the a-axis direction between adjacent buffer layers in the Z-axis direction satisfy the relation of 0.3%≤LMx≤0.8%.

Figure 3:
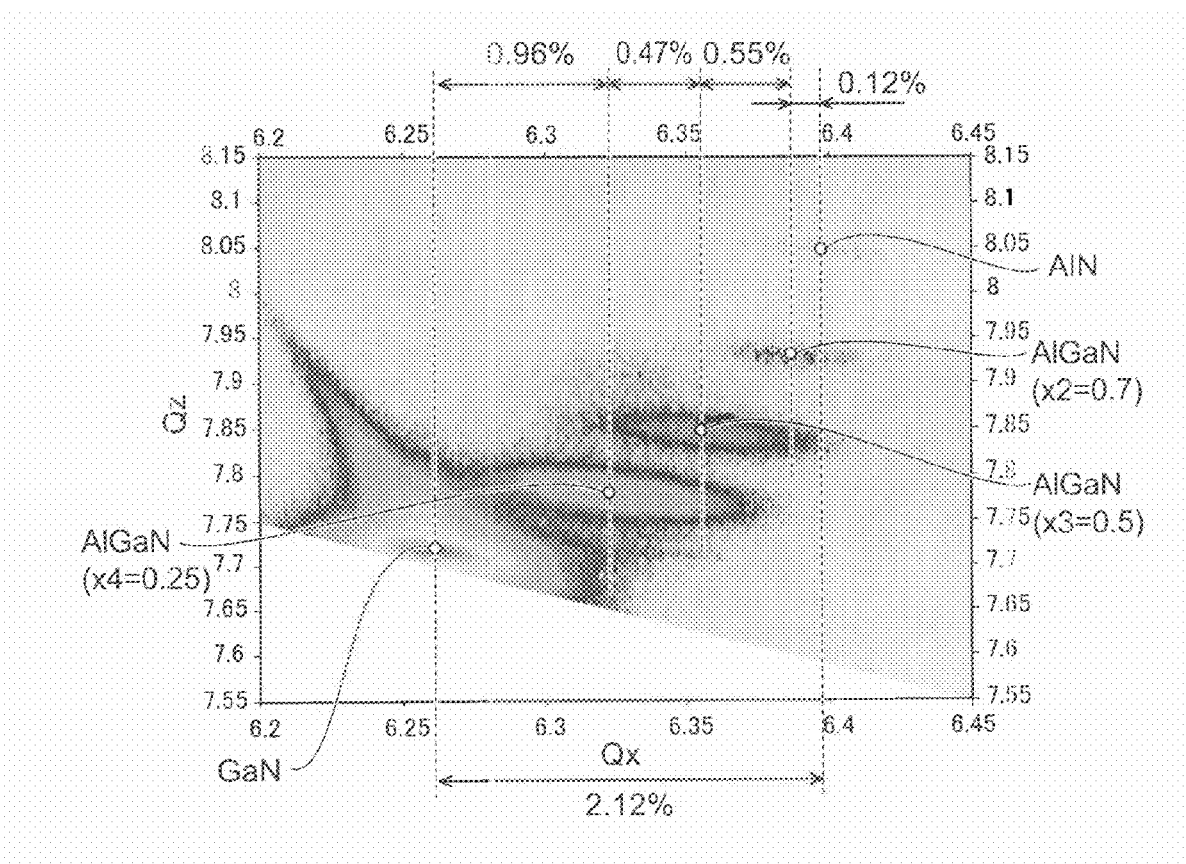
FIG. 3 is a reciprocal lattice space mapping illustrating a characteristics of a reference example.

FIG. 3 is a reciprocal lattice space mapping illustrating the characteristics of a reference example.

FIG. 3 shows the result of measuring the reciprocal lattice mapping in the following reference example. In the reference example, a plurality of AlGaN layers is provided between the AlN layer and the GaN layer, and the Al composition ratio is equally distributed.

In the reference example illustrated in FIG. 3, Al composition ratios are x1=1, x2=0.7, x3=0.5, x4=0.25, and x5=0.

As shown in FIG. 3, in the reference example, the lattice mismatches LMx in the a-axis direction of adjacent buffer layers in the Z-axis direction are 0.12%, 0.55%, 0.47%, and 0.96%. Thus, the lattice mismatch LMx in the a-axis direction between the first buffer layer BF1 and the second buffer layer BF2 is 0.12%, which is less than 0.3%. Furthermore, the lattice mismatch LMx in the a-axis direction between the fourth buffer layer BF4 and the fifth buffer layer BF5 is 0.96%, which is greater than 0.8%.

In the reference example, a plurality of AlGaN layers equally distributing the Al composition ratio is provided between the AlN layer and the GaN layer. Such configuration results in an excessively large lattice mismatch LMx in the a-axis direction and an excessively small lattice mismatch LMx in the a-axis direction between adjacent buffer layers in the Z-axis direction.

In the nitride semiconductor wafer 110 according to this embodiment, the first to n-th buffer layers BF1-BFn are configured so that the lattice mismatch LMx in the a-axis direction does not become excessively large and excessively small. In this example, the Al composition ratio is set so that all of the lattice mismatches LMx satisfy the relation of 0.3%≤LMx≤0.8%.

Such a configuration has been derived based on the following experimental results.

In the following, the result of experiments on the nitride semiconductor wafer originally performed by the inventor is described.

FIG. 4 is a table illustrating the characteristics of the nitride semiconductor wafer.

FIG. 4 shows the growth condition of the first to fifth buffer layers BF1-BF5 of three samples, i.e., first to third samples SP01-SP03. In the experiment, based on the growth condition shown in FIG. 4, the first to third samples SP01-SP03 are fabricated and characterized.

FIG. 4 shows the following experimental condition:

The thickness t0 (μm) of the silicon substrate 40, and the thickness t1 (nm), t2 (nm), t31 (nm), t4 (nm), and t5 (nm) of the first to fifth buffer layers BF1-BF5, respectively, The growth temperature GT1 (° C.), growth temperature GT2 (° C.), growth temperature GT3 (° C.), growth temperature GT4 (° C.), and growth temperature GT5 (° C.) of the first to fifth buffer layers BF1-BF5, respectively, The flow rate TMA1 (ccm, cc/minute), TMA2 (ccm), TMA3 (ccm), TMA4 (ccm), and TMA5 (ccm) of trimethylaluminum (TMA) gas of the first to fifth buffer layers BF1-BF5, respectively, The flow rate N1 (lm, liter/minute), flow rate N2 (lm), flow rate N3 (lm), flow rate N4 (lm), and flow rate N5 (lm) of ammonia ($NH_3$) gas of the first to fifth buffer layers BF1-BF5, respectively, The growth rate GR1 (nm/minute), growth rate GR2 (nm/minute), growth rate GR3 (nm/minute), growth rate GR4 (nm/minute), and growth rate GR5 (nm/minute) of the first to fifth buffer layers BF1-BF5, and The Al composition ratio x2, x3, and x4 of the second to fourth buffer layers BF2-BF4, respectively.

In this experiment, the Al composition ratio x1 in the first buffer layer BF1 is 1, and the Al composition ratio x5 in the fifth buffer layer BF5 is 0.

The growth rates GR1-GR5 are determined by dividing the film thickness by the growth time.

If the first buffer layer BF1 is formed on the silicon substrate 40, the silicon substrate 40 (nitride semiconductor wafer) is warped due to the lattice constant difference in the first direction between silicon and the first buffer layer BF1. Likewise, if the (i+1)-th buffer layer BF(i+1) is formed on the i-th buffer layer BFi, the silicon substrate 40 is warped due to the lattice length difference in the first direction between the i-th buffer layer BFi and the (i+1)-th buffer layer BF(i+1). In the first to third samples SP01-SP03, the curvature change (warpage) of the silicon substrate 40 in response to film formation of the first to fifth buffer layers BF1-BF5 is measured by an optical monitor.

Figure 5:
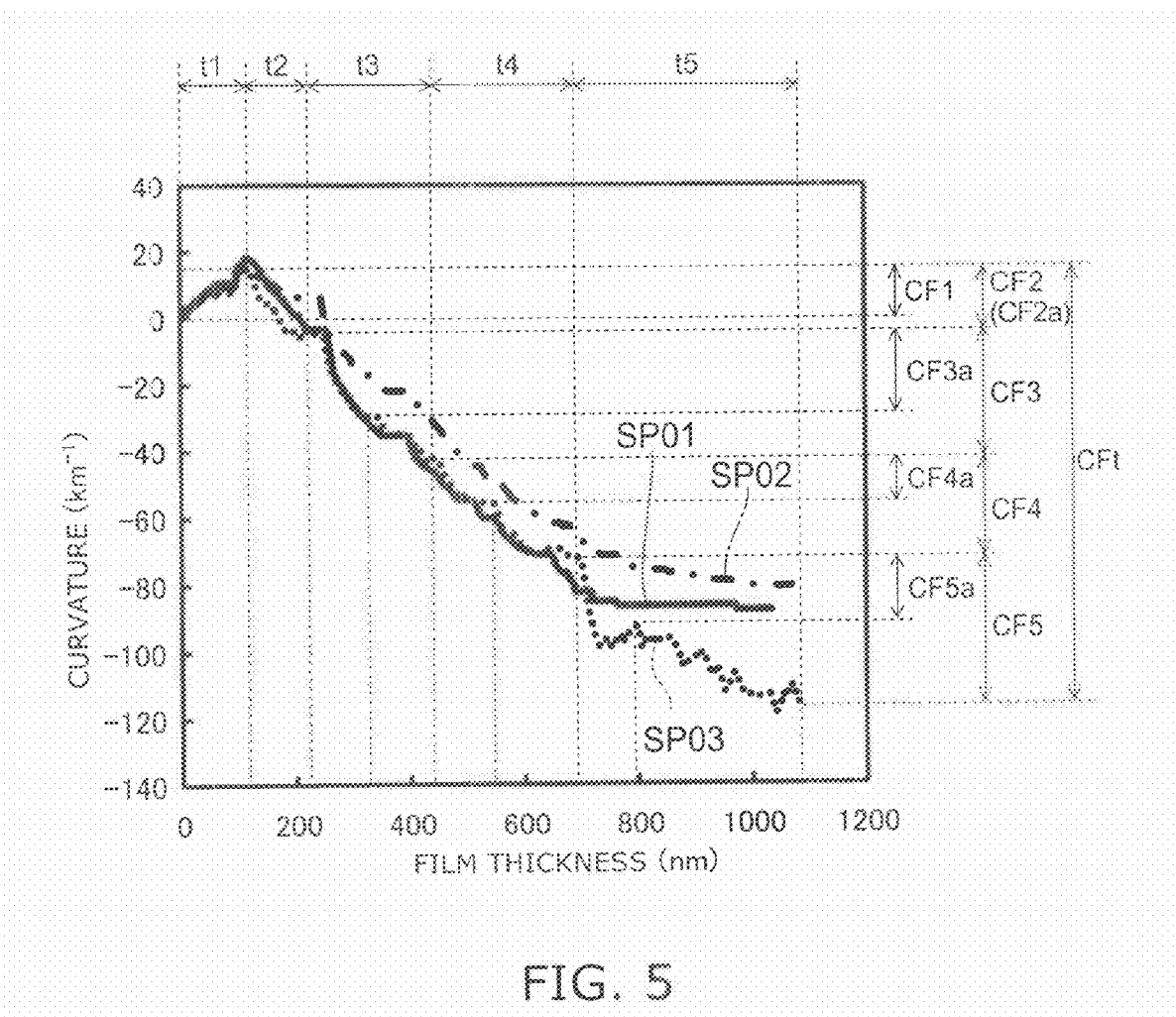
FIG. 5 is a graph illustrating characteristics of the nitride semiconductor wafer.

FIG. 5 is a graph illustrating the characteristics of the nitride semiconductor wafer.

FIG. 5 shows the curvature change of the silicon substrate 40 in response to sequential film formation of the first to fifth buffer layers BF1-BF5 in the first to third samples SP01-SP03.

In FIG. 5, the vertical axis represents the curvature CF ($km^{-1}$) of the nitride semiconductor wafer. The horizontal axis represents the thickness T (nm) of the buffer section 50. The thickness T being 0 nm corresponds to the interface between the silicon substrate 40 and the first buffer layer BF1.

The thickness of the silicon substrate 40 of the third sample SP03 is different from the first sample SP01 and the second sample SP02. For instance, on a plurality of silicon substrates 40 different in thickness, the same buffer section 50 is provided to form a plurality of samples. Then, the curvature of the silicon substrate 40 correlates with the thickness of the silicon substrate 40. This is because in the case of forming the same buffer section 50, even if the thickness of the silicon substrate 40 is changed, the stress applied to the buffer section 50 is substantially equal. The correlation between the curvature of the silicon substrate 40 and the thickness of the silicon substrate 40 is expressed by e.g. equation (2).

$$K = \frac{1}{R} = \frac{1}{M} \frac{6\sigma_f h_f}{h_s^2} \quad (2)$$

In equation (2), K is the curvature of the silicon substrate 40. R is the curvature radius of the silicon substrate 40. $M_s$ is the elastic coefficient of the silicon substrate 40. $\sigma_f$ is the thin film stress of the nitride semiconductor layer (e.g., first to fifth buffer layers BF1-BF5). $h_f$ is the thin film thickness of the nitride semiconductor layer. $h_s$ is the thickness of the silicon substrate 40.

In FIG. 5, the change of the curvature of the third sample SP03 is calculated from a value converted to the curvature for the thickness (525 μm) of the silicon substrate 40 of the first sample SP01 and the silicon substrate 40 of the second sample SP02 using equation (2).

In the case where the curvature CF is negative, the position in the Z-axis direction of the center of the silicon substrate 40 is higher than the position in the Z-axis direction of the edge of the silicon substrate 40. The curvature CF being negative corresponds to the state of the silicon substrate 40 warped in an upward convex shape. Conversely, the curvature CF being positive corresponds to the state of the silicon substrate 40 warped in a downward convex shape.

As shown in FIG. 5, in response to film formation of the first to fifth buffer layers BF1-BF5, the curvature of the silicon substrate 40 is changed. That is, the silicon substrate 40 is warped. For instance, the thickness t1 of the first buffer layer BF1 of the third sample SP03 is 120 nm (see FIG. 4). Hence, in FIG. 5, the variation of the curvature CF in the range of the thickness T from 0 nm to 120 nm is the curvature variation CF1 of the silicon substrate 40 associated with the film formation of the first buffer layer BF1. The variation of the curvature in the range of the thickness T from 0 nm to 120 nm is the difference between the curvature of the silicon substrate 40 before the film formation of the first buffer layer BF1 and the curvature of the silicon substrate 40 after the film formation of the first buffer layer BF1. For instance, in the third sample SP03, the curvature variation CF1 of the silicon substrate 40 associated with the film formation of the first buffer layer BF1 is approximately 14.4 $km^{-1}$ (converted value).

The thickness t2 of the second buffer layer BF2 of the third sample SP03 is 100 nm (see FIG. 4). The variation of the curvature CF in the range of the thickness T from 120 nm to 220 nm is the curvature variation CF2 of the silicon substrate 40 associated with the film formation of the second buffer layer BF2. In the third sample SP03, the curvature variation CF2 of the silicon substrate 40 associated with the film formation of the second buffer layer BF2 is approximately −18.1 $km^{-1}$ (converted value).

The thickness t3 of the third buffer layer BF3 of the third sample SP03 is 215 nm (see FIG. 4). The variation of the curvature CF in the range of the thickness T from 220 nm to 435 nm is the curvature variation CF3 of the silicon substrate 40 associated with the film formation of the third buffer layer BF3. In the third sample SP03, the curvature variation CF3 of the silicon substrate 40 associated with the film formation of the third buffer layer BF3 is approximately −38.6 $km^{-1}$ (converted value).

The thickness t4 of the fourth buffer layer BF4 of the third sample SP03 is 250 nm (see FIG. 4). The variation of the curvature CF in the range of the thickness T from 435 nm to 685 nm is the curvature variation CF4 of the silicon substrate 40 associated with the film formation of the fourth buffer layer BF4. In the third sample SP03, the curvature variation CF4 of the silicon substrate 40 associated with the film formation of the fourth buffer layer BF4 is approximately −29.8 $km^{-1}$ (converted value).

The thickness t5 of the fifth buffer layer BF5 of the third sample SP03 is 400 nm (see FIG. 4). The variation of the curvature CF in the range of the thickness T from 685 nm to 1085 nm is the curvature variation CF5 of the silicon substrate 40 associated with the film formation of the fifth buffer layer BF5. In the third sample SP03, the curvature variation CF5 of the silicon substrate 40 associated with the film formation of the fifth buffer layer BF5 is approximately −44.0 $km^{-1}$ (converted value).

Furthermore, in this characterization, variations of the curvature of the silicon substrate 40 due to film formation of the respective buffer layers are compared with each other. To this end, based on the above measurement result, the curvature variation of the silicon substrate 40 in response to film formation of the second to fifth buffer layers BF2-BF5 to a thickness of 100 nm is determined as follows.

As described above, the thickness t2 of the second buffer layer BF2 of the third sample SP03 is 100 nm. Thus, the curvature variation CF2a of the silicon substrate 40 associated with the film formation of the second buffer layer BF2 to a thickness of 100 nm is equal to the curvature variation CF2. In the third sample SP03, the curvature variation CF2a is approximately −18.1 $km^{-1}$ (converted value).

In the third sample SP03, the variation of the curvature CF in the range of the thickness T from 220 nm to 320 nm is the curvature variation CF3a of the silicon substrate 40 associated with the film formation of the third buffer layer BF3 to a thickness of 100 nm. In the third sample SP03, the curvature variation CF3a is approximately −25.8 km$^{-1}$ (converted value).

In the third sample SP03, the variation of the curvature CF in the range of the thickness T from 435 nm to 535 nm is the curvature variation CF4a of the silicon substrate 40 associated with the film formation of the fourth buffer layer BF4 to a thickness of 100 nm. In the third sample SP03, the curvature variation CF4a is approximately −13.3 km$^{-1}$ (converted value).

In the third sample SP03, the variation of the curvature CF in the range of the thickness T from 685 nm to 785 nm is the curvature variation CF5a of the silicon substrate 40 associated with the film formation of the fifth buffer layer BF5 to a thickness of 100 nm. In the third sample SP03, the curvature variation CF5a is approximately −22.6 km$^{-1}$ (converted value).

Here, the measurement apparatus used in the experiment has a limit to the measurement of the curvature CF. At that measurement limit, the maximum of the sum of the total curvature variation CFt on the negative side and the curvature variation CF1 on the positive side is approximately −85 km$^{-1}$. In the first sample SP01, in the range of the thickness T of 700 nm or more, the measurement apparatus reaches the measurement limit. Thus, the curvature variations CF5 and CF5a of the first sample SP01 were not able to be measured.

As shown in FIG. 5, in the case of forming the first buffer layer BF1 on the silicon substrate 40, the curvature of the silicon substrate 40 changes to the positive side. On the other hand, in the case of forming the second buffer layer BF2 on the first buffer layer BF1, in the case of forming the third buffer layer BF3 on the second buffer layer BF2, in the case of forming the fourth buffer layer BF4 on the third buffer layer BF3, and in the case of forming the fifth buffer layer BF5 on the fourth buffer layer BF4, the curvature of the silicon substrate 40 changes to the negative side.

In the case of forming an AlN layer on a silicon layer, a tensile stress is applied to the AlN layer due to the lattice constant difference in the first direction between silicon and AlN. In the case of forming an AlGaN layer on an AlN layer, a compressive stress is applied to the AlGaN layer due to the lattice length difference in the a-axis direction between AlN and AlGaN. Furthermore, in the case of forming, on a first AlGaN layer, a second AlGaN layer having a lower Al composition ratio than the first AlGaN layer, a compressive stress is applied to the second AlGaN layer due to the lattice length difference in the a-axis direction between the two AlGaN layers different in Al composition ratio. Furthermore, in the case of forming a GaN layer on an AlGaN layer, a compressive stress is applied to the GaN layer due to the lattice length difference in the a-axis direction between AlGaN and GaN. The difference in the direction of curvature change between the film formation of the first buffer layer BF1 and the film formation of the second to fifth buffer layers BF2-BF5 results from the difference of the applied stress.

In the case of negative curvature, the silicon substrate 40 is warped in an upward convex shape. That is, in the first to third samples SP01-SP03, by the film formation of the second to fifth buffer layers BF2-BF5, the silicon substrate 40 is warped in an upward convex shape.

In the third sample SP03, the total curvature variation CFt of CF2, CF3, CF4, and CF5 is approximately −130.4 km$^{-1}$ (converted value). The total curvature variation CFt is the total curvature variation of the silicon substrate 40 due to compressive stress. On the other hand, in the third sample SP03, the total curvature variation CFa of CF2a, CF3a, CF4a, and CF5a is approximately −79.8 km$^{-1}$ (converted value). In FIG. 5, t1-t5, CF1-CF5, CF2a-CF5a, and CFt of the third sample SP03 are illustrated.

FIG. 6 is a table illustrating the characteristics of the nitride semiconductor wafer.

FIG. 6 shows the measurement result of the characteristics of the first to third samples SP01-SP03 and the curvature change of the silicon substrate 40.

FIG. 6 shows the measurement result of the lattice mismatch and the curvature variation. More specifically, FIG. 6 shows the lattice mismatch LM2 (%) in the a-axis direction between the first buffer layer BF1 and the second buffer layer BF2, the lattice mismatch LM3 (%) in the a-axis direction between the second buffer layer BF2 and the third buffer layer BF3, the lattice mismatch LM4 (%) in the a-axis direction between the third buffer layer BF3 and the fourth buffer layer BF4, and the lattice mismatch LM5 (%) in the a-axis direction between the fourth buffer layer BF4 and the fifth buffer layer BF5. FIG. 6 shows the lattice mismatch LMt (%) in the a-axis direction between the first buffer layer BF1 and the fifth buffer layer BF5. The lattice mismatches LM2-LM5 and LMt are the values obtained from the reciprocal lattice space mapping.

Furthermore, FIG. 6 shows:

The relaxation SR2 in the a-axis direction of the second buffer layer BF2, the relaxation SR3 in the a-axis direction of the third buffer layer BF3, the relaxation SR4 in the a-axis direction of the fourth buffer layer BF4, and the relaxation SR5 in the a-axis direction of the fifth buffer layer BF5, The curvature variation CF2a (km$^{-1}$), CF3a (km$^{-1}$), CF4a (km$^{-1}$), and CF5a (km$^{-1}$) of the silicon substrate 40 associated with the film formation of the second to fifth buffer layers BF2-BF5 to a thickness of 100 nm, respectively, The curvature variation CF2 (km$^{-1}$), CF3 (km$^{-1}$), CF4 (km$^{-1}$), and CF5 (km$^{-1}$) of the silicon substrate 40 associated with the film formation of the second to fifth buffer layers BF2-BF5, The total curvature variation CFa (km$^{-1}$) of CF2a, CF3a, CF4a, and CF5a, and The total curvature variation CFt (km$^{-1}$) of CF2, CF3, CF4, and CF5.

In the first sample SP01, the curvature variations CF5 and CF5a reach the measurement limit. Thus, in FIG. 6, CF5, CF5a, CFa, and CFt of the first sample SP01 are left blank. In the third sample SP03, the sum of the total curvature variation CFt on the negative side and the curvature variation CF1 on the positive side is −39.8 km$^{-1}$, which is in the measurement range. In the third sample SP03, the thickness of the silicon substrate 40 is 950 µm, which is different from that of the first sample SP01 and the second sample SP02. Thus, in the third sample SP03, for the total curvature variation CFt on the negative side and the curvature variation CF1 on the positive side, a value converted to the curvature for a substrate thickness of 525 µm using equation (2) is shown in parentheses.

In the second sample SP02, the sum of the total curvature variation CFt on the negative side and the curvature variation CF1 on the positive side is −80.8 km$^{-1}$, which is in the measurement range.

The relaxation SRi in the a-axis direction of the (i+1)-th buffer layer BF(i+1) provided on the i-th buffer layer BFi is determined by e.g. equation (3).

$$SRi = \frac{a2 - a1}{a2_R - a1} \quad (3)$$

In equation (3), a1 is the lattice length in the a-axis direction of the i-th buffer layer BFi. a2 is the lattice length in the a-axis direction of the (i+1)-th buffer layer BF(i+1). $a2_R$ is the lattice length in the a-axis direction of the completely relaxed (i+1)-th buffer layer BF(i+1). In the case where a lattice length a2 in the a-axis direction of the (i+1)-th buffer layer BF(i+1) completely coincides with a lattice length a1 in the a-axis direction of the i-th buffer layer BFi (in the case where the (i+1)-th buffer layer BF(i+1) is completely strained), the relaxation SRi in the a-axis direction of the (i+1)-th buffer layer BF(i+1) is 0. In the case where the lattice length a2 of the (i+1)-th buffer layer BF(i+1) coincides with the lattice length a1 in the a-axis direction of the completely relaxed (i+1)-th buffer layer BF(i+1) (in the case where the (i+1)-th buffer layer (BF(i+1) is completely relaxed), the relaxation SRi in the a-axis direction of the (i+1)-th buffer layer BF(i+1) is 1. The relaxation SRi in the a-axis direction of the (i+1)-th buffer layer BF(i+1) is made closer to 0 as the lattice mismatch between the lattice length a2 in the a-axis direction of the (i+1)-th buffer layer BF(i+1) and the lattice length a1 in the a-axis direction of the i-th buffer layer BFi becomes smaller and the film thickness of the (i+1)-th buffer layer BF(i+1) becomes thinner.

As shown in FIGS. 5 and 6, the total curvature variation CFt is −97.2 km$^{-1}$ in the second sample SP02, and −130.4 km$^{-1}$ (converted value) in the third sample SP03. The curvature variation CFt of the third sample SP03 is larger than the curvature variation CFt of the second sample SP02. Furthermore, as shown in FIG. 5, the curvature variation CFt of the first sample SP01 is larger than the curvature variation CFt of the second sample SP02.

Hence, the compressive stress applied to the buffer section 50 of the first sample SP01 is larger than the compressive stress applied to the buffer section 50 of the second sample SP02. The compressive stress applied to the buffer section 50 of the third sample SP03 is larger than the compressive stress applied to the buffer section 50 of the second sample SP02. In the first sample SP01 and the third sample SP03, a larger compressive stress can be applied to the buffer section 50 compared to the second sample SP02, and cracks can be further suppressed.

The first to third samples SP01-SP03 are further analyzed.

Figure 7:
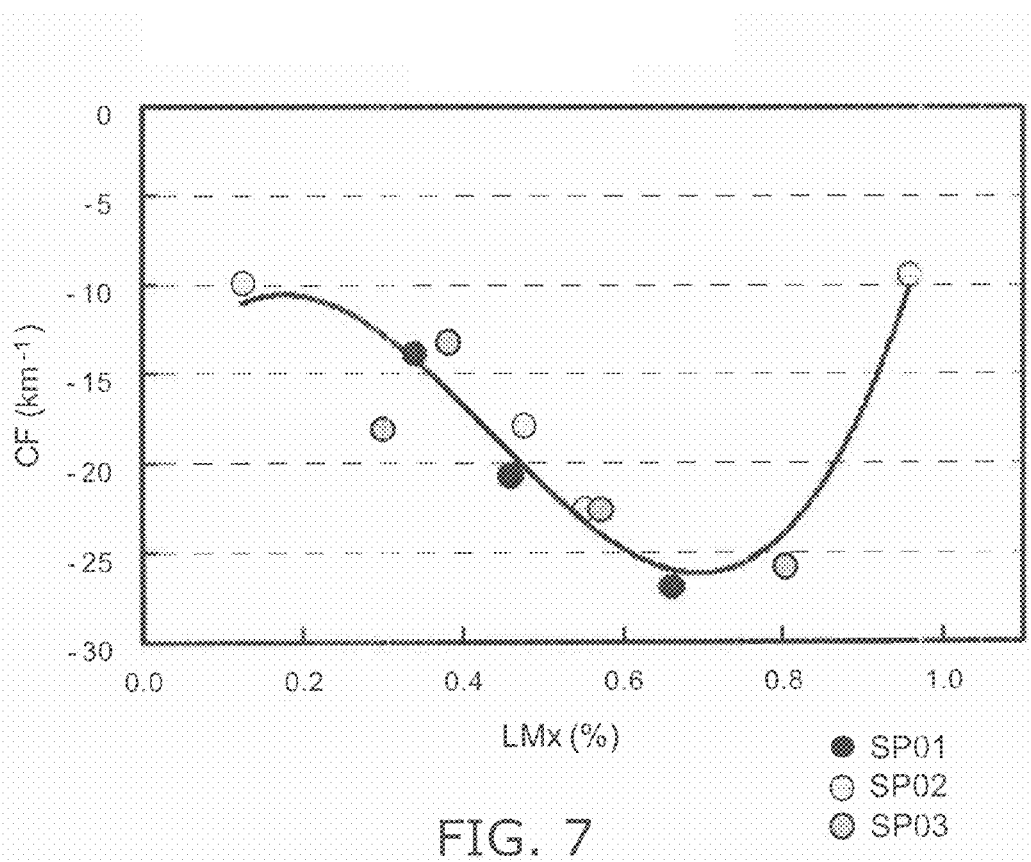
FIG. 7 is a graph illustrating characteristics of the nitride semiconductor wafer.

FIG. 7 is a graph illustrating the characteristics of the nitride semiconductor wafer.

FIG. 7 is a graph plotting the curvature variations CF2a, CF3a, CF4a, and CF5a of the first to third samples SP01-SP03. In FIG. 7, the vertical axis represents the curvature variation CF (km$^{-1}$) of the silicon substrate 40. The horizontal axis represents the lattice mismatch LMx (%) in the a-axis direction between the adjacent buffer layers in the Z-axis direction. FIG. 7 is an example of the relationship between the lattice mismatch LMx in the a-axis direction and the curvature variation CF in the case of forming a nitride semiconductor layer with a thickness of 100 nm.

As described above, CF5a of the first sample SP01 reaches the measurement limit of the measurement apparatus. Thus, CF5a of the first sample SP01 cannot be plotted in FIG. 7. Furthermore, for CF2a, CF3a, CF4a, and CF5a of the third sample SP03, the converted values determined by equation (2) are used.

As shown in FIG. 7, in the region of LMx≤0.8%, the absolute value of the curvature variation CF increases with the increase of the lattice mismatch LMx. On the other hand, in the region of 0.8%<LMx, the absolute value of the curvature variation CF decreases with the increase of the lattice mismatch LMx. It is considered that in the region of 0.8%<LMx, the absolute value of the curvature variation CF decreases with the increase of the lattice mismatch LMx because the lattice mismatch LMx becomes too large and causes lattice relaxation. By setting LMx≤0.8%, lattice relaxation can be suppressed. Furthermore, the occurrence of dislocations associated with lattice relaxation can be suppressed.

As shown in FIG. 7, the absolute value of the curvature variation CF of the nitride semiconductor wafer in the region of LMx<0.3% is smaller than the absolute value of the curvature variation CF of the nitride semiconductor wafer in the region of 0.3%≤LMx≤0.8%. The nitride semiconductor wafer is warped in an upward convex shape if a compressive stress is applied to the buffer section 50. The magnitude of the curvature of the nitride semiconductor wafer warped in an upward convex shape follows the magnitude of the compressive stress applied to the buffer section 50. Thus, the compressive stress applied to the buffer section 50 in the case of LMx<0.3% is smaller than the compressive stress applied to the buffer section 50 in the case of 0.3%≤LMx≤0.8%.

By setting 0.3%≤LMx, the number of AlGaN layers between the AlN layer and the GaN layer can be suppressed. For instance, the number of AlGaN layers can be suppressed to 7 or less. Increase in the number of AlGaN layers complicates the setting of the growth condition such as the flow rate of TMA gas and the flow rate of TMG gas. This makes it difficult to manufacture the nitride semiconductor wafer. Hence, by setting 0.3%≤LMx, manufacturing of the nitride semiconductor wafer can be facilitated.

Furthermore, in order to obtain a change in curvature of the nitride semiconductor wafer which is equivalent to the case where the lattice mismatch is in a range of 0.3%≤LMx≤0.8% when the actual lattice mismatch LMx is in the range of LMx<0.3%, the AlGaN layer must be made thick. A thick AlGaN layer is likely to lose flatness. Loss of flatness of the AlGaN layer may incur the decrease of compressive stress of the nitride semiconductor layer grown on the AlGaN layer. Hence, by setting 0.3%≤LMx, the nitride semiconductor wafer can be thinned, and cracks can be suppressed.

In the embodiment, the first to fifth buffer layers BF1-BF5 are formed so as to satisfy the relation of 0.3%≤LMx≤0.8% for all of the lattice mismatches LMx in the a-axis direction between adjacent buffer layers in the Z-axis direction. Thus, larger compressive stress can be applied to the buffer section 50 compared to the case where the lattice mismatch LMx is not in the range of 0.3%≤LMx≤0.8%.

In the first sample SP01 of this experiment, the lattice mismatches LM2-LM5 satisfy the relation of 0.3%≤LMx≤0.8% (see FIG. 6).

In contrast, in the second sample SP02, the lattice mismatch LM2 and the lattice mismatch LM5 do not satisfy the relation of 0.3%≤LMx≤0.8%.

In the third sample SP03, the lattice mismatches LM2-LM5 satisfy the relation of 0.3%≤LMx≤0.8%.

As described above, the curvature variation of the first sample SP01 is larger than the curvature variation of the second sample SP02, and the compressive stress applied to the buffer section 50 of the first sample SP01 is larger than the compressive stress applied to the buffer section 50 of the second sample SP02. The curvature variation of the third sample SP03 is larger than the curvature variation of the second sample SP02, and the compressive stress applied to the buffer section 50 of the third sample SP03 is larger than the compressive stress applied to the buffer section 50 of the second sample SP02. Thus, the first to fifth buffer layers BF1-BF5 are formed so that all of the lattice mismatches LMx in the a-axis direction of the adjacent buffer layers in the Z-axis direction satisfy the relation of 0.3%≤LMx≤0.8%. Accordingly, a greater compressive stress can be applied to the buffer section 50 than in the case of not satisfying the relation of 0.3%≤LM≤0.8%.

As expressed in equation (2), the curvature of the silicon substrate 40 correlates with the thickness of the silicon substrate 40. Hence, even if the thickness of the silicon substrate 40 is changed, the first to fifth buffer layers BF1-BF5 can be formed so that all of the lattice mismatches LMx in the a-axis direction of the adjacent buffer layers in the Z-axis direction satisfy the relation of 0.3%≤LMx≤0.8% as in the case of setting the thickness of the silicon substrate 40 to 525 μm shown in FIG. 7. Thus, a greater compressive stress can be applied to the buffer section 50 than in the case of not satisfying the relation of 0.3%≤LMx≤0.8%.

In the nitride semiconductor wafer 110, the thermal expansion coefficient of the functional layer 10s and the buffer section 50 containing nitride semiconductor is different from the thermal expansion coefficient of the silicon substrate 40. Thus, when the nitride semiconductor wafer 110 is decreased from the growth temperature to room temperature, a tensile stress is applied to the functional layer 10s and the buffer section 50. In conventional nitride semiconductor wafers, due to the tensile stress applied during temperature decrease, the nitride semiconductor wafer is warped in a downward convex shape. This may generate cracks in the functional layer 10s.

In the nitride semiconductor wafer 110, the tensile stress applied to the functional layer 10s during decreasing to room temperature can be balanced by the compressive stress of the buffer section 50. For instance, the warpage of the nitride semiconductor wafer 110 decreased to room temperature is suppressed. Thus, in the nitride semiconductor wafer 110, the occurrence of cracks in the functional layer 10s can be suppressed.

There is a semiconductor device in which a buffer layer containing $Al_mGa_{1-m}N$ (0≤m≤1) is provided between the substrate and the functional layer. The Al composition ratio of the buffer layer is decreased from the substrate toward the functional layer. In the semiconductor device of this reference example, for instance, the Al composition ratio is decreased as 1.0, 0.8, 0.6, 0.4, 0.2, and 0. That is, the buffer layer of the semiconductor device of the reference example includes five buffer layers with the Al composition ratio equally distributed. The lattice mismatch LMc in the a-axis direction obtained from physical properties between AlN and GaN is 2.5%. The lattice mismatch LMt in the a-axis direction obtained from experiments between AlN and GaN is e.g. 1.9% or more and 2.5% or less. If this is equally divided by five buffer layers with the Al composition ratio equally distributed, the lattice mismatches LMx in the a-axis direction between adjacent buffer layers in the Z-axis direction are 0.38% or more and 0.50% or less.

However, in the case where the lattice mismatch LMt in the a-axis direction between the AlN layer and GaN layer is equally divided by five buffer layers with equally distributing the Al composition ratio, the lattice mismatches LMx in the a-axis direction between the adjacent buffer layers in the Z-axis direction do not necessarily all fall within the range of 0.3%≤LMx≤0.8%. For instance, forming $Al_{0.85}Ga_{0.15}N$ of 100 nm on AlN results in strained growth of $Al_{0.85}Ga_{0.15}N$. Then, the lattice mismatch LMx between AlN and $Al_{0.85}Ga_{0.15}N$ becomes 0.0%, which is smaller than 0.3%.

The case where equally distributing the Al composition ratio is substantially equivalent to equally distributing the lattice mismatch LMt in the a-axis direction between the AlN layer and the GaN layer is the case where e.g. $Al_mGa_{1-m}N$ is completely relaxed.

In the case of forming a buffer layer by e.g. epitaxial growth, the buffer layer is affected by the crystallinity and lattice length of the foundation layer. Thus, to obtain completely relaxed $Al_mGa_{1-m}N$ requires growing $Al_mGa_{1-m}N$ with a very large thickness of 1000 nm or more, although depending on the Al composition ratio.

However, no compressive stress is applied in completely relaxed $Al_mGa_{1-m}N$ as its relaxation SRi in the a-axis direction is 1. Thus, completely relaxed $Al_mGa_{1-m}N$ does not contribute to the suppression of cracks. Hence, the relaxation SRi in the a-axis direction of the (i+1)-th buffer layer BF(i+1) provided on the i-th buffer layer BFi needs to be smaller than 1. The relaxation SRi in the a-axis direction of the (i+1)-th buffer layer BF(i+1) which is formed on the i-th buffer layer BFi is preferably e.g. 0.65 or less.

Furthermore, in the case where the film thickness of $Al_mGa_{1-m}N$ is set to approximately 1 nm or more and 50 nm or less, $Al_mGa_{1-m}N$ is likely to undergo strained growth. Then, equally distributing the Al composition ratio does not correspond to equally distributing the lattice mismatch LMt in the a-axis direction between AlN and GaN.

In the nitride semiconductor wafer 110 according to this embodiment, for instance, the lattice mismatch LMt between AlN and GaN is divided by AlGaN so that all of the lattice mismatches LMx in the a-axis direction of the adjacent buffer layers in the Z-axis direction satisfy the relation of 0.3%≤LMx≤0.8%. Thus, a great compressive stress can be applied to the buffer section 50 than in a case where the lattice mismatches LMx do not satisfy the relation of 0.3%≤LMx≤0.8

In the embodiment, the thickness t1 is e.g. 120 nm (80 nm or more and 180 nm or less). The thickness t2 is e.g. 100 nm (50 nm or more and 150 nm or less). The thickness t3 is e.g. 200 nm (150 nm or more and 250 nm or less). The thickness t4 is e.g. 250 nm (200 nm or more and 300 nm or less). The thickness t5 is e.g. 400 nm (350 nm or more and 450 nm or less).

Alternatively, the thickness t1 is e.g. 240 nm (200 nm or more and 300 nm or less). The thickness t2 is e.g. 150 nm (100 nm or more and 200 nm or less). The thickness t3 is e.g. 300 nm (250 nm or more and 350 nm or less). The thickness t4 is e.g. 400 nm (350 nm or more and 450 nm or less). The thickness t5 is e.g. 500 nm (450 nm or more and 550 nm or less).

Alternatively, the thickness t1 is e.g. 360 nm (300 nm or more and 400 nm or less). The thickness t2 is e.g. 200 nm (150 nm or more and 250 nm or less). The thickness t3 is e.g. 400 nm (350 nm or more and 450 nm or less). The thickness t4 is e.g. 500 nm (450 nm or more and 550 nm or less). The thickness t5 is e.g. 600 nm (550 nm or more and 650 nm or less).

Thus, the thickness t2, thickness t3, thickness t4, and thickness t5 may be changed corresponding to the thickness t1. According to the embodiment, the thicknesses t1-t5 are not limited to the above-disclosed specific values. For example, the thicknesses t2, t3, t4 and t5 may be appropriately set within a range where the curvature CF of the nitride wafer 110 may change as the growth of the buffer layer proceeds.

Figure 8:
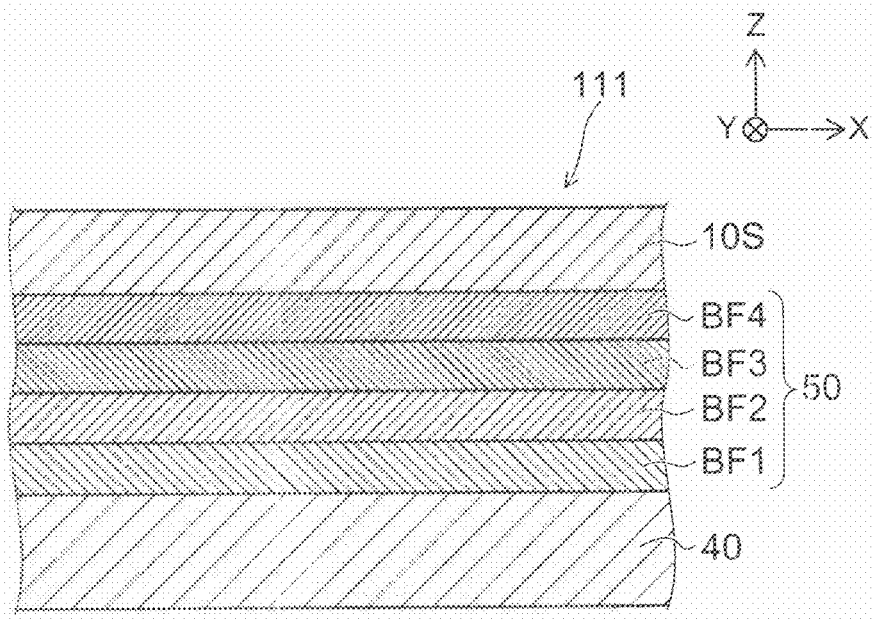
FIG. 8 is a schematic sectional view illustrating a configuration of an alternative nitride semiconductor wafer according to the first embodiment.

FIG. 8 is a schematic sectional view illustrating the configuration of an alternative nitride semiconductor wafer according to the first embodiment.

As shown in FIG. 8, in the nitride semiconductor wafer 111, the buffer section 50 includes four nitride semiconductor layers, i.e., first to fourth buffer layers BF1-BF4.

In this example, the fourth buffer layer BF4 contains $Al_{x4}Ga_{1-x4}N$ ($0 \leq x4 < x3$). In this example, the fourth buffer layer BF4 contains e.g. GaN. That is, in the nitride semiconductor wafer 111, between the first buffer layer BF1 being an AlN layer and the fourth buffer layer BF4 being a GaN layer, two AlGaN layers of the second buffer layer BF2 and the third buffer layer BF3 are provided.

Also in this nitride semiconductor wafer 111, the buffer section 50 is formed so that all of the lattice mismatches LMx in the a-axis direction of the adjacent buffer layers in the Z-axis direction satisfy the relation of $0.3\% \leq LMx \leq 0.8\%$. Thus, cracks in the functional layer 10s can be suppressed.

Figure 9:
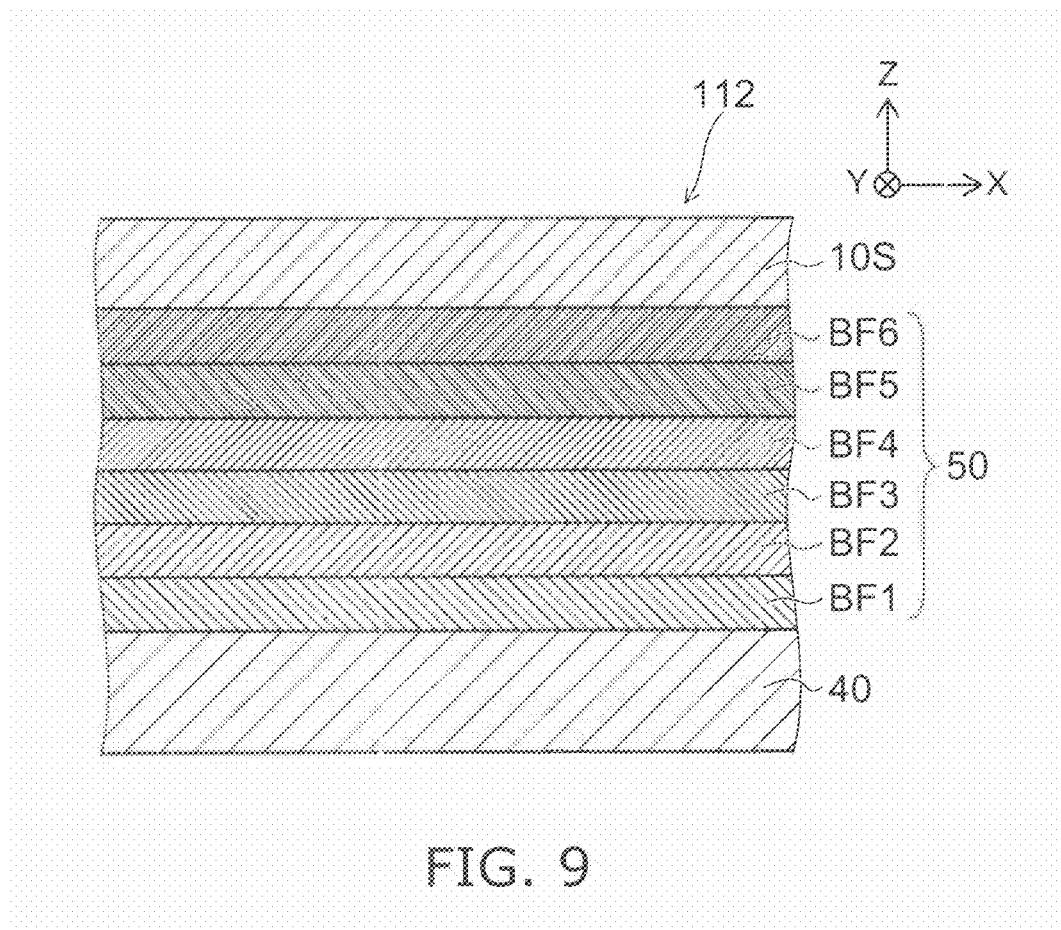
FIG. 9 is a schematic sectional view illustrating a configuration of an alternative nitride semiconductor wafer according to the first embodiment.

FIG. 9 is a schematic sectional view illustrating the configuration of an alternative nitride semiconductor wafer according to the first embodiment.

As shown in FIG. 9, in the nitride semiconductor wafer 112, the buffer section 50 includes six nitride semiconductor layers, i.e., first to sixth buffer layers BF1-BF6.

In this example, the fifth buffer layer BF5 contains $Al_{x5}Ga_{1-x5}N$ ($0 < x5 < x4$). In this example, the fifth buffer layer BF5 contains e.g. AlGaN. The sixth buffer layer BF6 contains $Al_{x6}Ga_{1-x6}N$ ($0 \leq x6 < x5$). The sixth buffer layer BF6 contains e.g. GaN. The sixth buffer layer BF6 has a lattice length (sixth lattice length W6) in the aforementioned first direction. The sixth buffer layer BF6 satisfies the relation of $0.003 \leq (W6-W5)/W5 \leq 0.008$.

In the nitride semiconductor wafer 112, between the first buffer layer BF1 being an AlN layer and the sixth buffer layer BF6 being a GaN layer, four AlGaN layers of the second to fifth buffer layers BF2-BF5 are provided.

Also in this nitride semiconductor wafer 112, the buffer section 50 is formed so that all of the lattice mismatches LMx in the a-axis direction of the adjacent buffer layers in the Z-axis direction satisfy the relation of $0.3\% \leq LMx \leq 0.8\%$. Thus, cracks in the functional layer 10s can be suppressed.

Figure 10:
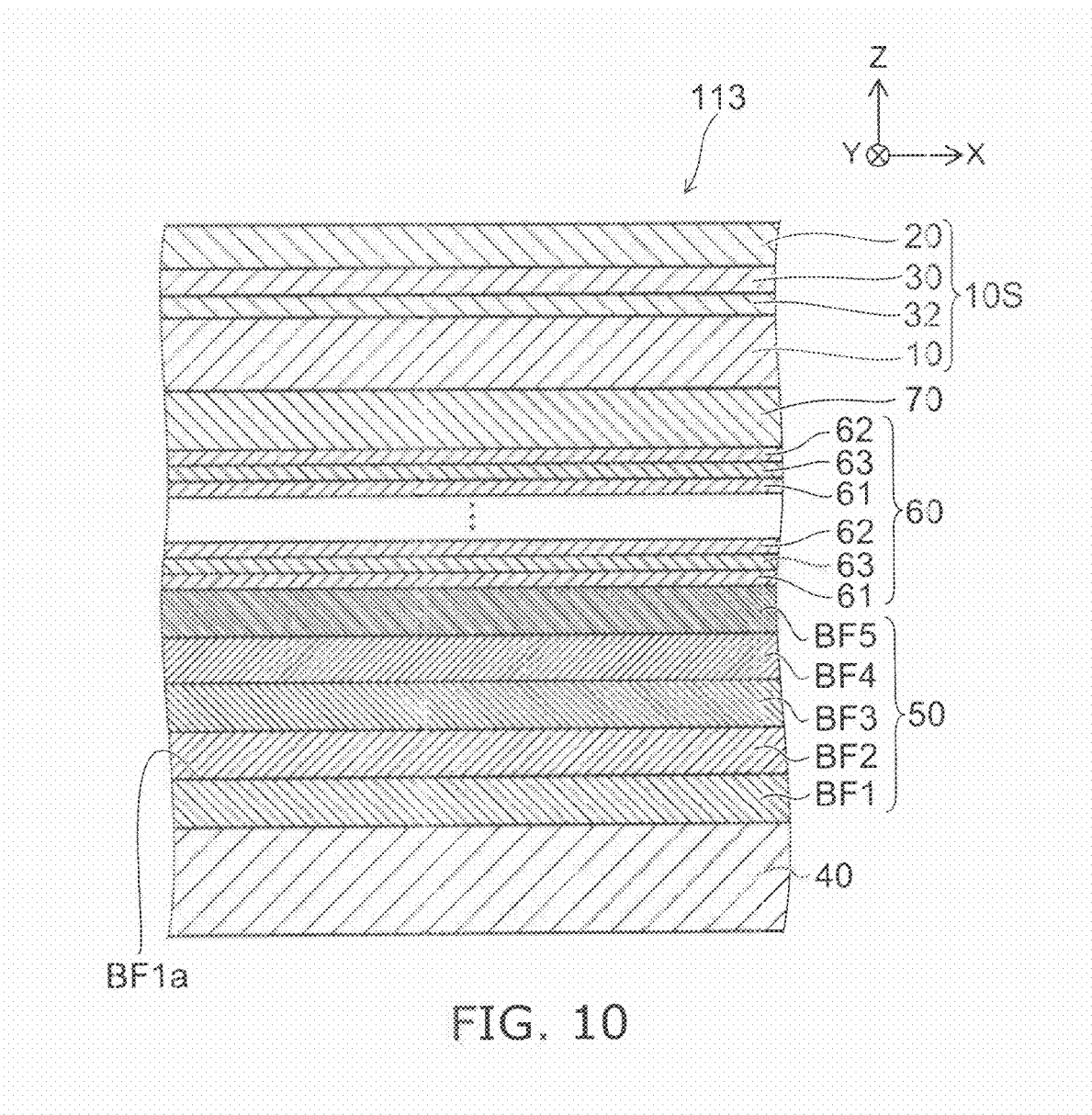
FIG. 10 is a schematic sectional view illustrating a configuration of an alternative nitride semiconductor wafer according to the first embodiment.

FIG. 10 is a schematic sectional view illustrating the configuration of an alternative nitride semiconductor wafer according to the first embodiment.

As shown in FIG. 10, in the nitride semiconductor wafer 113, the functional layer 10s includes a first semiconductor layer 10, a second semiconductor layer 20, a light emitting layer 30, and a multilayer section 32. That is, the nitride semiconductor wafer 113 is a wafer for manufacturing a semiconductor light emitting device as a nitride semiconductor device.

The first semiconductor layer 10 contains nitride semiconductor. The first semiconductor layer 10 contains e.g. GaN of a first conductivity type. The first conductivity type is n-type, and the second conductivity type is p-type. Alternatively, the first conductivity type may be p-type, and the second conductivity type may be n-type. In the following description, it is assumed that the first conductivity type is n-type, and the second conductivity type is p-type. For instance, the first semiconductor layer 10 is an n-type GaN layer.

The first semiconductor layer 10 is provided on the buffer section 50. The multilayer section 32 is provided on the first semiconductor layer 10. The light emitting layer 30 is provided on the multilayer section 32. That is, the light emitting layer 30 is provided on the first semiconductor layer 10, and the multilayer section 32 is provided between the first semiconductor layer 10 and the light emitting layer 30. The second semiconductor layer 20 is provided on the light emitting layer 30. The second semiconductor layer 20 contains nitride semiconductor, and is of the second conductivity type. The second semiconductor layer 20 is e.g. a p-type GaN layer. By passing a current in the light emitting layer 30 through the first semiconductor layer 10 and the second semiconductor layer 20, light is emitted from the light emitting layer 30. The multilayer section 32 is provided as appropriate in the functional layer 10s, and can be omitted.

Figure 11:
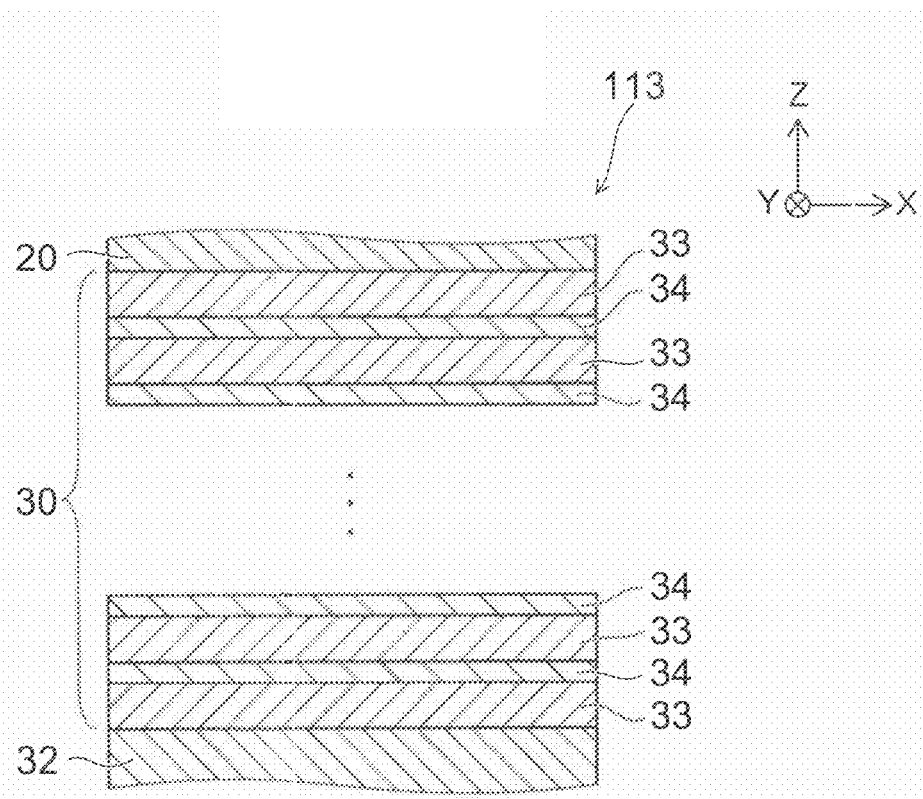
FIG. 11 is a schematic sectional view illustrating a configuration of part of an alternative nitride semiconductor wafer according to the first embodiment.

FIG. 11 is a schematic sectional view illustrating the configuration of part of the alternative nitride semiconductor wafer according to the first embodiment.

As shown in FIG. 11, the light emitting layer 30 includes a plurality of barrier layers 33 and a well layer 34 provided between the plurality of barrier layers 33. For instance, a plurality of barrier layers 33 and a plurality of well layers 34 are alternately stacked along the Z-axis direction.

The number of well layers 34 may be either 1, or 2 or more. That is, the light emitting layer 30 can have an SQW (single-quantum well) structure or an MQW (multi-quantum well) structure.

The bandgap energy of the barrier layer 33 is larger than the bandgap energy of the well layer 34. The well layer 34 is made of e.g. $In_{\alpha}Ga_{1-\alpha}N$ ($0 < \alpha < 1$). The barrier layer 33 is made of e.g. GaN.

The barrier layer 33 contains a nitride semiconductor containing a group III element and a group V element. The well layer 34 contains a nitride semiconductor containing a group III element and a group V element. The well layer 34 contains a nitride semiconductor containing e.g. indium (In) and gallium (Ga).

Figure 12:
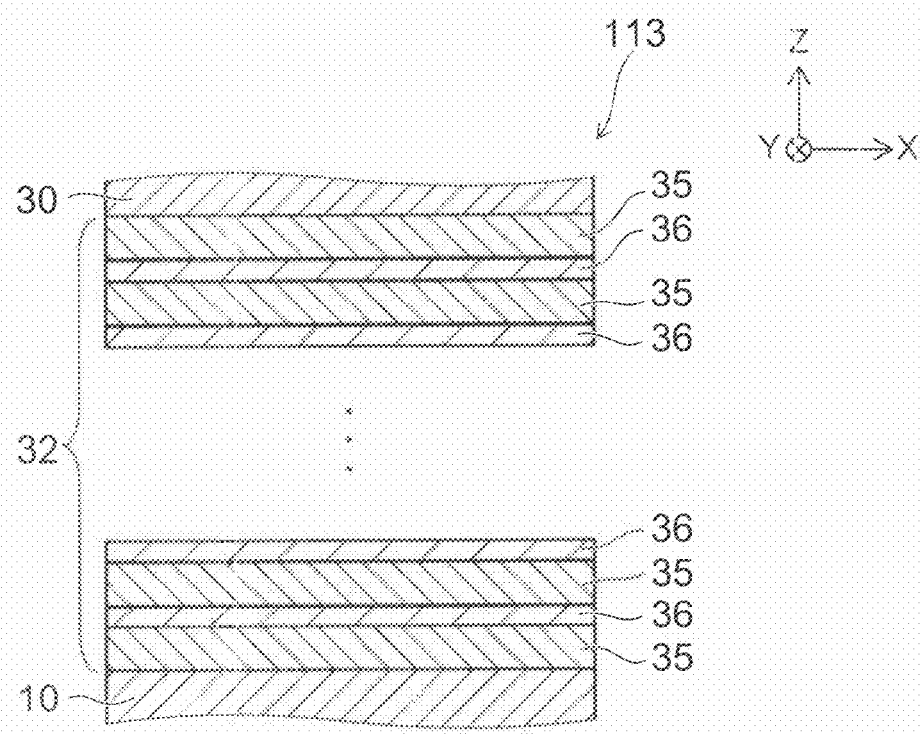
FIG. 12 is a schematic sectional view illustrating a configuration of part of an alternative nitride semiconductor wafer according to the first embodiment.

FIG. 12 is a schematic sectional view illustrating the configuration of part of the alternative nitride semiconductor wafer according to the first embodiment.

As shown in FIG. 12, the multilayer section 32 includes a plurality of high bandgap energy layers 35 and a plurality of low bandgap energy layers 36 stacked alternately. Each of the plurality of low bandgap energy layers 36 is provided between an adjacent pair of the plurality of high bandgap energy layers 35. The plurality of high bandgap energy layers 35 contain nitride semiconductor. The plurality of low bandgap energy layers 36 contain nitride semiconductor. Each bandgap energy of the plurality of low bandgap energy layers 36 is lower than each bandgap energy of the plurality of high bandgap energy layers 35. Each bandgap energy of the plurality of low bandgap energy layers 36 is higher than each bandgap energy of the plurality of well layers 34.

The multilayer section 32 is e.g. a superlattice layer.

The high bandgap energy layer 35 contains a nitride semiconductor containing a group III element and a group V element. The low bandgap energy layer 36 contains a nitride semiconductor containing a group III element and a group V element. The low bandgap energy layer 36 contains a nitride semiconductor containing e.g. In and Ga.

In this example, the nitride semiconductor wafer 113 further includes an intermediate layer 60.

The intermediate layer 60 is provided between the buffer section 50 and the functional layer 10s. The intermediate layer 60 includes a first layer 61, a second layer 62, and a third layer 63. The second layer 62 is provided on the first layer 61. The third layer 63 is provided on the first layer 61 and between the first layer 61 and the second layer 62. For instance, the set of the first layer 61, the third layer 63, and the second layer 62 stacked in this order is stacked in a plurality along the Z-axis direction.

The first layer 61 contains a nitride semiconductor containing Al. The second layer 62 contains a nitride semiconductor having a lower Al composition ratio than the first layer 61. The third layer 63 contains a nitride semiconductor containing Al. The Al composition ratio of the third layer 63 is lower than the Al composition ratio of the first layer 61, and higher than the Al composition ratio of the second layer 62. The first layer 61 is e.g. an AlN layer. The second layer 62 is e.g. a GaN layer. The third layer 63 is e.g. an AlGaN layer.

The thickness of the first layer 61 is e.g. 12 nm (e.g., 10 nm or more and 14 nm or less). The thickness of the second layer 62 is e.g. 450 nm (e.g., 300 nm or more and 600 nm or less). The thickness of the third layer 63 is e.g. 20 nm (e.g., 15 nm or more and 25 nm or less).

By providing an intermediate layer 60, for instance, propagation of defects such as threading dislocations due to lattice mismatch between the silicon substrate 40 and the functional layer 10s is suppressed. Thus, for instance, the performance of the nitride semiconductor device can be improved. In the intermediate layer 60, the third layer 63 is provided as needed, and can be omitted.

In this example, the nitride semiconductor wafer 113 further includes a foundation layer 70.

The foundation layer 70 is provided between the buffer section 50 and the functional layer 10s. In this example, the foundation layer 70 is provided between the intermediate layer 60 and the functional layer 10s. The foundation layer 70 contains nitride semiconductor. The concentration of impurity contained in the foundation layer 70 is lower than the concentration of impurity contained in the functional layer 10s. The concentration of impurity contained in the foundation layer 70 is lower than the concentration of impurity contained in the first semiconductor layer 10. The foundation layer 70 is e.g. a non-doped GaN layer (i-GaN layer). The thickness of the foundation layer 70 is e.g. 500 nm or more. The foundation layer 70 is provided as needed, and can be omitted.

Also in the nitride semiconductor wafer 113, the buffer section 50 is formed so that all of the lattice mismatches LMx in the a-axis direction of the adjacent buffer layers in the Z-axis direction satisfy the relation of 0.3%≤LMx≤0.8%. Thus, the occurrence of cracks in the functional layer 10s can be suppressed. Furthermore, in the nitride semiconductor wafer 113, by providing an intermediate layer 60, for instance, propagation of dislocations to the functional layer 10s is suppressed.

Figure 13:
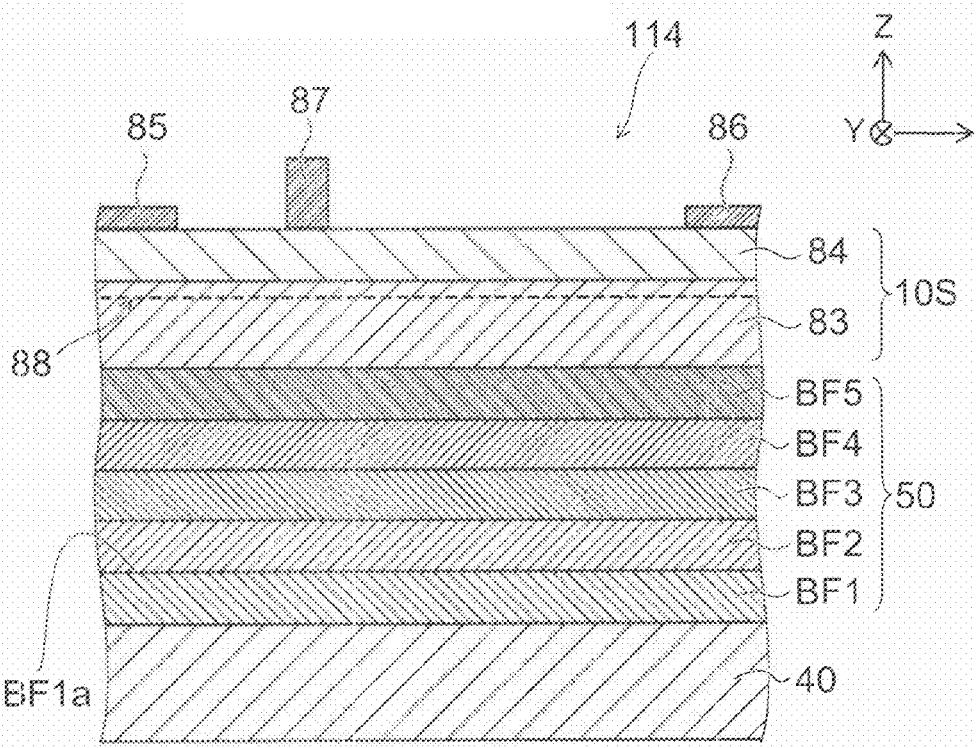
FIG. 13 is a schematic sectional view illustrating a configuration of an alternative nitride semiconductor wafer according to the first embodiment.

FIG. 13 is a schematic sectional view illustrating the configuration of an alternative nitride semiconductor wafer according to the first embodiment.

As shown in FIG. 13, in the nitride semiconductor wafer 114, the functional layer 10s includes a third semiconductor layer 83 provided on the buffer section 50, and a fourth semiconductor layer 84 provided on the third semiconductor layer 83 and having a larger bandgap than the third semiconductor layer 83. This nitride semiconductor wafer 114 is a wafer for manufacturing e.g. a GaN-based HEMT as a nitride semiconductor device.

The third semiconductor layer 83 is a channel layer. The fourth semiconductor layer 84 is a barrier layer. The third semiconductor layer 83 and the fourth semiconductor layer 84 form a heterojunction. The third semiconductor layer 83 is made of e.g. AlGaN or GaN. The fourth semiconductor layer 84 is made of e.g. AlGaN or GaN. The third semiconductor layer 83 is e.g. non-doped. For instance, the third semiconductor layer 83 contains no impurity. The fourth semiconductor layer 84 is e.g. non-doped or of n-type. For instance, the fourth semiconductor layer 84 contains no impurity, or contains n-type impurity. The third semiconductor layer 83 is e.g. a non-doped GaN layer. The fourth semiconductor layer 84 is e.g. a non-doped or n-type AlGaN layer.

On the fourth semiconductor layer 84, a source electrode 85 and a drain electrode 86 are provided and spaced from each other. The source electrode 85 and the drain electrode 86 are each in ohmic contact with the surface of the fourth semiconductor layer 84. A gate electrode 87 is provided on the fourth semiconductor layer 84 between the source electrode 85 and the drain electrode 86. The gate electrode 87 is in Schottky contact with the surface of the fourth semiconductor layer 84.

The lattice constant of the fourth semiconductor layer 84 is smaller than the lattice constant of the third semiconductor layer 83. This generates strain in the fourth semiconductor layer 84. By the piezoelectric effect, piezoelectric polarization occurs in the fourth semiconductor layer 84. Thus, a two-dimensional electron gas 88 is formed near the interface with the fourth semiconductor layer 84 in the third semiconductor layer 83. By controlling the voltage applied to the gate electrode 87, the concentration of the two-dimensional electron gas 88 below the gate electrode 87 is increased or decreased. This controls the current flowing between the source electrode 85 and the drain electrode 86.

Also in this nitride semiconductor wafer 114, the buffer section 50 is formed so that all of the lattice mismatches LMx in the a-axis direction of the adjacent buffer layers in the Z-axis direction satisfy the relation of 0.3%≤LMx≤0.8%. Thus, the occurrence of cracks in the functional layer 10s can be suppressed.

(Second Embodiment)

Figure 14:
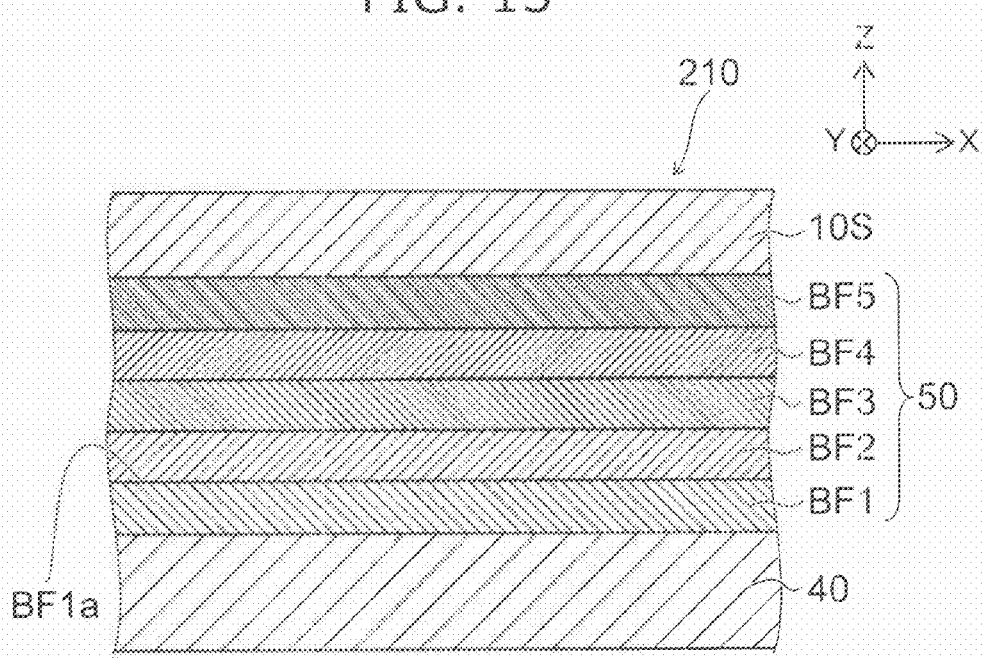
FIG. 14 is a schematic sectional view illustrating a configuration of a nitride semiconductor device according to a second embodiment.

FIG. 14 is a schematic sectional view illustrating the configuration of a nitride semiconductor device according to a second embodiment.

As shown in FIG. 14, the nitride semiconductor device 210 according to this embodiment includes a buffer section 50 and a functional layer 10s.

The nitride semiconductor device 210 is manufactured from the nitride semiconductor wafer 110. The buffer section 50 is formed on a silicon substrate 40. In the nitride semiconductor device 210, the silicon substrate 40 can be omitted. The buffer section 50 and the functional layer 10s can be based on the configuration described with reference to the first embodiment.

Thus, the nitride semiconductor device 210 with suppressed occurrence of cracks in the functional layer 10s is provided.

(Third Embodiment)

This embodiment relates to a method for manufacturing a nitride semiconductor wafer. This embodiment corresponds to part of a method for manufacturing a nitride semiconductor device.

FIGS. 15A to 15D are sequential schematic sectional views illustrating the method for manufacturing a nitride semiconductor wafer according to the third embodiment.

Figure 15A:
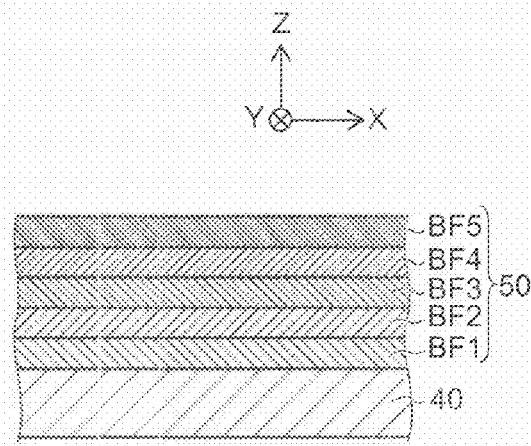
FIGS. 15A to 15D are sequential schematic sectional views illustrating a method for manufacturing a nitride semiconductor wafer according to a third embodiment.

As shown in FIG. 15A, on a silicon substrate 40, a first buffer layer BF1 is formed. For instance, an AlN layer having a thickness of 120 nm is formed as the first buffer layer BF1. On the first buffer layer BF1, a second buffer layer BF2 is formed. For instance, an AlGaN layer having a thickness of 100 nm and an Al composition ratio of 50% is formed as the second buffer layer BF2. On the second buffer layer BF2, a third buffer layer BF3 is formed. For instance, an AlGaN layer having a thickness of 200 nm and an Al composition ratio of 30% is formed as the third buffer layer BF3. On the third buffer layer BF3, a fourth buffer layer BF4 is formed. For instance, an AlGaN layer having a thickness of 250 nm and an Al composition ratio of 15% is formed as the fourth buffer layer BF4. On the fourth buffer layer BF4, a fifth buffer layer BF5 is formed. For instance, a GaN layer having a thickness of 400 nm is formed as the fifth buffer layer BF5. Thus, a buffer section 50 is formed on the silicon substrate 40.

In the buffer section 50, the Al composition ratio of the AlGaN layer of the second to fourth buffer layers BF2-BF4 is adjusted so that all of the lattice mismatches LMx in the a-axis direction of the adjacent buffer layers in the Z-axis direction satisfy the relation of 0.3% ≤ LMx ≤ 0.8% in the first to fifth buffer layers BF1-BF5. Thus, a compressive stress larger than that in the case of not satisfying the relation of 0.3%≤LMx≤0.8% is applied to the buffer section 50. This suppresses the occurrence of cracks in the functional layer 10s formed later.

Figure 15C:
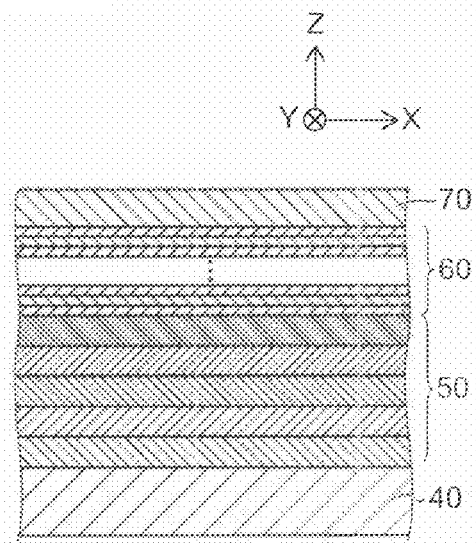
Figure 15B:
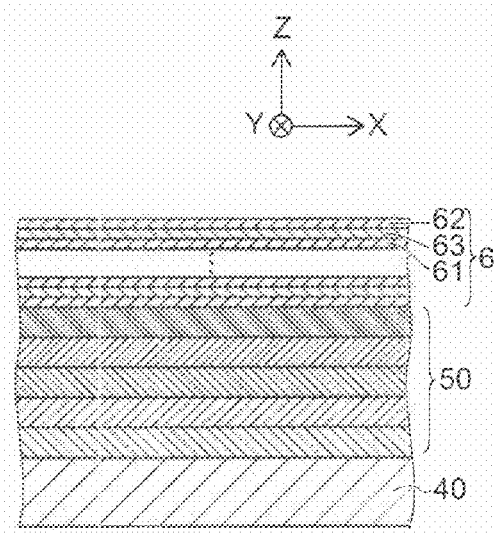

As shown in FIG. 15B, on the buffer section 50 (fifth buffer layer BF5), a first layer 61 is formed. For instance, an AlN layer having a thickness of 12 nm is formed as the first layer 61. On the first layer 61, a third layer 63 is formed. For instance, an AlGaN layer having a thickness of 24 nm is formed as the third layer 63. On the third layer 63, a second layer 62 is formed. For instance, a GaN layer having a thickness of 350 nm is formed as the second layer 62. Formation of the first layer 61, the third layer 63, and the second layer 62 is repeated a plurality of times. Thus, the set of the first layer 61, the third layer 63, and the second layer 62 is stacked in a plurality. Accordingly, an intermediate layer 60 is formed on the buffer section 50.

As shown in FIG. 15C, on the intermediate layer 60, a foundation layer 70 is formed. For instance, an i-GaN layer having a thickness of 1000 nm is formed as the foundation layer 70.

Figure 15D:
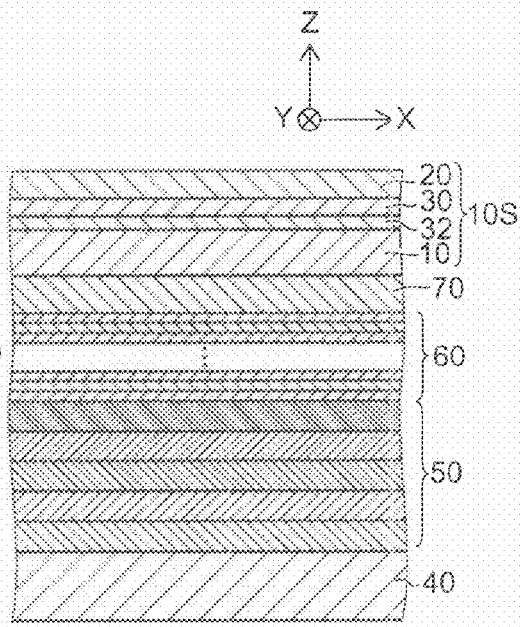

As shown in FIG. 15D, on the foundation layer 70, a first semiconductor layer 10 is formed. For instance, an n-type GaN layer having a thickness of 1000 nm is formed as the first semiconductor layer 10.

On the first semiconductor layer 10, a plurality of high bandgap energy layers 35 and low bandgap energy layers 36 are alternately stacked. The high bandgap energy layer 35 is e.g. a GaN layer. The low bandgap energy layer 36 is e.g. an InGaN layer. Thus, a multilayer section 32 is formed on the first semiconductor layer 10.

On the multilayer section 32, a plurality of barrier layers 33 and well layers 34 are alternately stacked. The barrier layer 33 is e.g. a GaN layer. The well layer 34 is e.g. an InGaN layer. Thus, a light emitting layer 30 is formed on the multilayer section 32.

On the light emitting layer 30, a second semiconductor layer 20 is formed. For instance, a p-type GaN layer having a thickness of 100 nm is formed as the second semiconductor layer 20. Thus, a functional layer 10s is formed on the foundation layer 70.

Accordingly, the nitride semiconductor wafer 113 is completed.

In the embodiment, growth of semiconductor layers can be based on e.g. the metal-organic chemical vapor deposition (MOCVD) method, metal-organic vapor phase epitaxy (MOVPE) method, molecular beam epitaxy (MBE) method, and halide vapor phase epitaxy (HVPE) method.

For instance, in the case of using the MOCVD method or MOVPE method, the following materials can be used in forming each semiconductor layer. As a material of Ga, for instance, TMGa (trimethylgallium) and TEGa (triethylgallium) can be used. As a material of In, for instance, TMIn (trimethylindium) and TEIn (triethylindium) can be used. As a material of Al, for instance, TMAl (trimethylaluminum) can be used. As a material of N, for instance, $NH_3$ (ammonia), MMHy (monomethylhydrazine), and DMHy (dimethylhydrazine) can be used. As a material of Si, for instance, $SiH_4$ (monosilane) and $Si_2H_6$ (disilane) can be used.

Figure 16:
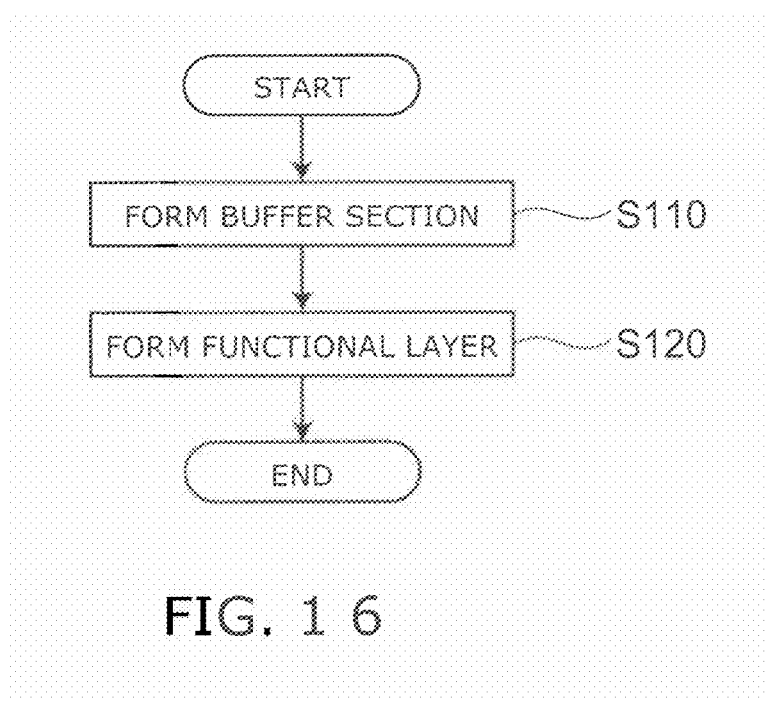
FIG. 16 is a flow chart illustrating a method for manufacturing a nitride semiconductor wafer according to the third embodiment.

FIG. 16 is a flow chart illustrating the method for manufacturing a nitride semiconductor wafer according to the third embodiment.

As shown in FIG. 16, the method for manufacturing a nitride semiconductor wafer according to the embodiment includes step S110 for forming a buffer section 50, and step S120 for forming a functional layer 10s.

In step S110, for instance, the processing described with reference to FIG. 15A is performed. In step S120, for instance, the processing described with reference to FIG. 15D is performed.

Thus, a nitride semiconductor wafer with suppressed occurrence of cracks in the functional layer 10s is manufactured.

In a case where nitride semiconductor devices are manufactured from a nitride semiconductor wafer according to the embodiment having the functional layer 10s, at least a part of the silicon substrate and/or at least a part of the buffer section 50 can be removed, and the functional layer 10s and a remaining part of the silicon substrate and the buffer section 50 (if any) can be bonded to another substrate.

The embodiments provide a nitride semiconductor wafer, a nitride semiconductor device, and a method for manufacturing a nitride semiconductor wafer with suppressed cracks.

In this description, the "nitride semiconductor" includes semiconductors of the chemical formula $B_xIn_yAl_zGa_{1-x-y-z}N$ (0≤x≤1, 0≤y≤1, 0≤z≤1, x+y+z≤1) of any compositions with the composition ratios x, y, and z varied in the respective ranges. Furthermore, the "nitride semiconductor" also includes those of the above chemical formula further containing group V elements other than N (nitrogen), those further containing various elements added to control various material properties such as conductivity type, and those further containing various unintended elements.

The embodiments of the invention have been described above with reference to examples. However, the embodiments of the invention are not limited to these examples. For instance, any specific configurations of various components such as the silicon substrate, buffer section, functional layer, first to n-th buffer layers, intermediate layer, and foundation layer included in the nitride semiconductor wafer and the nitride semiconductor device are encompassed within the scope of the invention as long as those skilled in the art can similarly practice the invention and achieve similar effects by suitably selecting such configurations from conventionally known ones.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor wafer comprising:
  a silicon substrate;
  a buffer section provided on the silicon substrate; and
  a functional layer provided on the buffer section and comprising a nitride semiconductor,
  wherein:
  the buffer section comprises first to n-th buffer layers comprising a nitride semiconductor, n being an integer of 4 or more;
  an i-th buffer layer, i being an integer of 1 or more and less than n, of the first to n-th buffer layers has a lattice length Wi in a first direction parallel to a major surface of the first buffer layer;

an (i+1)-th buffer layer in direct contact with the i-th buffer layer has a lattice length W(i+1) in the first direction; and in the first to n-th buffer layers, the i-th buffer layer and the (i+1)-th buffer layer satisfy a relation of $0.003 \leq (W(i+1)-Wi)/Wi \leq 0.008$.

2. The wafer according to claim 1, wherein
the major surface is a c-plane, and
the first direction is an a-axis direction.

3. The wafer according to claim 1, wherein
the first buffer layer comprises $Al_{x1}Ga_{1-x1}N$ (0<x1≤1),
the n-th buffer layer comprises $Al_{xn}Ga_{1-xn}N$ (0≤xn<1), and
the i-th buffer layer between the first buffer layer and the n-th buffer layer comprises $Al_{xi}Ga_{1-xi}N$ (0<xi1<1).

4. The wafer according to claim 3, wherein the Al composition ratio of the (i+1)-th buffer layer is lower than the Al composition ratio of the i-th buffer layer.

5. The wafer according to claim 1, wherein lattice mismatch in the first direction between the first buffer layer and the n-th buffer layer is from 1.9% to 2.5%.

6. The wafer according to claim 1, wherein n is 9 or less.

7. The wafer according to claim 1, wherein the (i+1)-th buffer layer has a relaxation of 0.65 or less.

8. The wafer according to claim 1, wherein the functional layer comprises:
a first semiconductor layer of a first conductivity type provided on the buffer section;
a light emitting layer provided on the first semiconductor layer; and
a second semiconductor layer of a second conductivity type provided on the light emitting layer.

9. The wafer according to claim 8, wherein
the light emitting layer comprises a plurality of barrier layers and a well layer provided between the plurality of barrier layers, and
a bandgap energy of the barrier layer is larger than a bandgap energy of the well layer.

10. The wafer according to claim 9, wherein
the barrier layers comprise a nitride semiconductor comprising a group III element and a group V element, and
the well layer comprises a nitride semiconductor comprising a group III element and a group V element.

11. The wafer according to claim 8, wherein
the functional layer further comprises a multilayer section provided between the first semiconductor layer and the light emitting layer,
the multilayer section comprises a plurality of high bandgap energy layers and a low bandgap energy layer provided between the plurality of high bandgap energy layers, and
a bandgap energy of the low bandgap energy layer is lower than a bandgap energy of the high bandgap energy layer.

12. The wafer according to claim 1, further comprising:
an intermediate layer provided between the buffer section and the functional layer,
wherein the intermediate layer comprises a first layer comprising a nitride semiconductor comprising Al, and a second layer provided on the first layer and comprising a nitride semiconductor having a lower Al composition ratio than the first layer.

13. The wafer according to claim 12, wherein
the intermediate layer further comprises a third layer comprising a nitride semiconductor comprising Al and provided between the first layer and the second layer, and
the Al composition ratio of the third layer is lower than the Al composition ratio of the first layer and higher than the Al composition ratio of the second layer.

14. The wafer according to claim 1, further comprising:
a foundation layer provided between the buffer section and the functional layer and comprising a nitride semiconductor,
wherein a concentration of impurity in the nitride semiconductor of the foundation layer is lower than a concentration of impurity in the nitride semiconductor of the functional layer.

15. The wafer according to claim 1, wherein
the functional layer comprises a third semiconductor layer provided on the buffer section, and a fourth semiconductor layer provided on the third semiconductor layer and forming a heterojunction with the third semiconductor layer, and
a bandgap of the fourth semiconductor layer is larger than a bandgap of the third semiconductor layer.

16. The wafer according to claim 15, wherein a lattice constant of the fourth semiconductor layer is smaller than a lattice constant of the third semiconductor layer.

17. A method for manufacturing the nitride semiconductor wafer according to claim 1, the method comprising:
forming the buffer section on the silicon substrate, and
forming the functional layer on the buffer section.

18. The wafer according to claim 1, wherein a thickness of the (i+1)-th buffer layer is set within a range where a curvature of the silicon substrate may change as the growth of the (i+1)-th buffer layer proceeds.

19. The wafer according to claim 18, wherein
a correlation between the curvature of the silicon substrate and a thickness of the silicon substrate is expressed by:

$$K = \frac{1}{R} = \frac{1}{M_s} \frac{6\sigma_f h_f}{h_s^2}$$

wherein:
K is the curvature of the silicon substrate,
R is a curvature radius of the silicon substrate,
$M_s$ is an elastic coefficient of the silicon substrate,
$\sigma_f$ is a thin film stress of the (i+1)-th buffer layer,
$h_f$ is the thickness of the (i+1)-th buffer layer, and
$h_s$ is the thickness of the silicon substrate.

20. A nitride semiconductor device comprising:
a buffer section formed on a silicon substrate and
a functional layer provided on the buffer section and comprising a nitride semiconductor,
wherein:
the buffer section comprises first to n-th buffer layers comprising a nitride semiconductor, n being an integer of 4 or more;
an i-th buffer layer i being an integer of 1 or more and less than n, of the first to n-th buffer layers has a lattice length Wi in a first direction parallel to a major surface of the first buffer layer;
an (i+1)-th buffer layer in direct contact with the i-th buffer layer has a lattice length W(i+1) in the first direction; and
in the first to n-th buffer layers, the i-th buffer layer and the (i+1)-th buffer layer satisfy a relation of $0.003 \leq (W(i+1)-Wi)/Wi \leq 0.008$.

21. The device according to claim 20, wherein
the major surface is a c-plane, and
the first direction is an a-axis direction.

22. The device according to claim 20, wherein
the first buffer layer comprises $Al_{x1}Ga_{1-x1}N$ (0<x1≤1),
the n-th buffer layer comprises $Al_{xn}Ga_{1-xn}N$ (0≤xn<1), and the i-th buffer layer between the first buffer layer and the n-th buffer layer comprises $Al_{xi}Ga_{1-xi}N$ ($0<xi<1$).

23. The device according to claim 22, wherein the Al composition ratio of the (i+1)-th buffer layer is lower than the Al composition ratio of the i-th buffer layer.

24. The device according to claim 20, wherein lattice mismatch in the first direction between the first buffer layer and the n-th buffer layer is from 1.9% to 2.5%.

25. The device according to claim 20, wherein n is 9 or less.

26. The device according to claim 20, wherein the (i+1)-th buffer layer has a relaxation of 0.65 or less.

27. The device according to claim 20, wherein the functional layer comprises:
- a first semiconductor layer of a first conductivity type provided on the buffer section;
- a light emitting layer provided on the first semiconductor layer; and
- a second semiconductor layer of a second conductivity type provided on the light emitting layer.

28. The device according to claim 27, wherein
the light emitting layer comprises a plurality of barrier layers and a well layer provided between the plurality of barrier layers, and
a bandgap energy of the barrier layer is larger than a bandgap energy of the well layer.

29. The device according to claim 28, wherein
the barrier layers comprise a nitride semiconductor comprising a group III element and a group V element, and
the well layer comprises a nitride semiconductor comprising a group III element and a group V element.

30. The device according to claim 27, wherein
the functional layer further comprises a multilayer section provided between the first semiconductor layer and the light emitting layer,
the multilayer section comprises a plurality of high bandgap energy layers and a low bandgap energy layer provided between the plurality of high bandgap energy layers, and
a bandgap energy of the low bandgap energy layer is lower than a bandgap energy of the high bandgap energy layer.

31. The device according to claim 20, further comprising:
an intermediate layer provided between the buffer section and the functional layer,
wherein the intermediate layer comprises a first layer comprising a nitride semiconductor comprising Al, and a second layer provided on the first layer and comprising a nitride semiconductor having a lower Al composition ratio than the first layer.

32. The device according to claim 31, wherein
the intermediate layer further comprises a third layer comprising a nitride semiconductor comprising Al and provided between the first layer and the second layer, and
the Al composition ratio of the third layer is lower than the Al composition ratio of the first layer and higher than the Al composition ratio of the second layer.

33. The device according to claim 20, further comprising:
a foundation layer provided between the buffer section and the functional layer and comprising a nitride semiconductor,
wherein a concentration of impurity in the nitride semiconductor of the foundation layer is lower than a concentration of impurity in the nitride semiconductor of the functional layer.

34. The device according to claim 20, wherein
the functional layer comprises a third semiconductor layer provided on the buffer section, and a fourth semiconductor layer provided on the third semiconductor layer and forming a heterojunction with the third semiconductor layer, and
a bandgap of the fourth semiconductor layer is larger than a bandgap of the third semiconductor layer.

35. The device according to claim 34, wherein a lattice constant of the fourth semiconductor layer is smaller than a lattice constant of the third semiconductor layer.

36. The device according to claim 20, wherein a thickness of the (i+1)-th buffer layer is set within a range where a curvature of the silicon substrate may change as the growth of the (i+1)-th buffer layer proceeds.

37. The device according to claim 36, wherein
a correlation between the curvature of the silicon substrate and a thickness of the silicon substrate is expressed by:

$$K = \frac{1}{R} = \frac{1}{M_s} \frac{6\sigma_f h_f}{h_s^2}$$

wherein:
K is the curvature of the silicon substrate,
R is a curvature radius of the silicon substrate,
$M_s$ is an elastic coefficient of the silicon substrate,
$\sigma_f$ is a thin film stress of the (i+1)-th buffer layer,
$h_f$ is the thickness of the (i+1)-th buffer layer, and
$h_s$ is the thickness of the silicon substrate.

* * * * *